US011079518B1

(12) United States Patent
Smyth et al.

(10) Patent No.: US 11,079,518 B1
(45) Date of Patent: Aug. 3, 2021

(54) TRANSPARENT TUNABLE OPTICAL ELEMENTS WITH STRUCTURALLY-MODIFIED ELECTROACTIVE POLYMER

(71) Applicant: Facebook Technologies, LLC, Menlo Park, CA (US)

(72) Inventors: Katherine Marie Smyth, Seattle, WA (US); Andrew John Ouderkirk, Redmond, WA (US); Spencer Allan Wells, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 258 days.

(21) Appl. No.: 16/288,898

(22) Filed: Feb. 28, 2019

(51) Int. Cl.
*G02B 3/12* (2006.01)
*G02B 27/01* (2006.01)
*H01L 41/047* (2006.01)
*G02B 27/09* (2006.01)

(52) U.S. Cl.
CPC .......... *G02B 3/12* (2013.01); *G02B 27/0172* (2013.01); *G02B 27/0955* (2013.01); *H01L 41/047* (2013.01)

(58) Field of Classification Search
CPC ...... G02B 3/14; G02B 26/004; G02B 26/005; G02B 3/12; G02B 1/043; G02B 1/041; G02B 7/028; G02B 13/0075; G02B 27/646; G02B 1/04; G02B 3/02; G02B 30/27; G02B 7/08; G02B 7/36; G02B 13/0085; G02B 13/18; G02B 1/06; G02B 26/0825; G02B 26/0833; G02B 27/0025; G02C 7/085; G02C 7/04; G02C 7/08; G02C 5/143; G02C 7/063; G02C 2202/18; G02C 2202/22; G02C 7/022; G02C 7/041; G02C 7/06; G02C 7/061; G02C 7/083; G02C 7/101; G02C 7/102; G02C 7/12

See application file for complete search history.

(56) References Cited

U.S. PATENT DOCUMENTS

| 3,461,044 | A | * | 8/1969 | Lyons, Jr. | .............. | C25D 15/02 205/103 |
| 5,081,547 | A | * | 1/1992 | Howell | ................ | G11B 20/182 360/31 |
| 2008/0182129 | A1 | * | 7/2008 | Klubek | ............... | H01L 51/0052 428/704 |
| 2010/0276492 | A1 | * | 11/2010 | Wang | ....................... | G02B 3/14 235/470 |

(Continued)

OTHER PUBLICATIONS

Miriyev et al., "Soft material for soft actuators", Nature Communications, Department of Mechanical Engineering, vol. 8, No. 596, 2017, pp. 1-8.

(Continued)

*Primary Examiner* — William R Alexander
*Assistant Examiner* — Sharrief I Broome
(74) *Attorney, Agent, or Firm* — FisherBroyles, LLP

(57) ABSTRACT

An optical element includes a primary electrode, a secondary electrode overlapping at least a portion of the primary electrode, and a structurally-modified and transparent electroactive polymer disposed between and abutting the primary electrode and the secondary electrode. An optical device may include a tunable lens and an optical element disposed over at least one surface of the tunable lens.

19 Claims, 21 Drawing Sheets

(56) References Cited

U.S. PATENT DOCUMENTS

| | | | | |
|---|---|---|---|---|
| 2012/0307347 | A1* | 12/2012 | Clapp | G02F 1/1685 |
| | | | | 359/296 |
| 2013/0100363 | A1* | 4/2013 | Kakinuma | H04N 13/341 |
| | | | | 349/13 |
| 2014/0303287 | A1* | 10/2014 | Li | D01F 6/70 |
| | | | | 524/4 |
| 2017/0186941 | A1* | 6/2017 | Aliane | H01L 41/0471 |
| 2017/0364726 | A1* | 12/2017 | Buchan | H01L 41/047 |
| 2021/0026045 | A1* | 1/2021 | Jacoby | G02C 7/085 |

OTHER PUBLICATIONS

Pilet et al., "Piezoelectricity enhancement of P(VDF/TrFE) by X-ray irradiation", Organic Electronics, vol. 37, 2016, pp. 257-262.

Liu et al., "Control of crystal morphology and its effect on electro-mechanical performances of electrostrictive P(VDF-TrFE-CTFE) terpolymer", European Polymer Journal, vol. 91, 2017, pp. 46-60.

Le et al., "All-organic electrostrictive polymer composites with low driving electrical voltages for micro-fluidic pump applications", Scientific Reports, 5:11814, 2015, pp. 1-13.

Xia et al., "PVDF-based dielectric polymers and their applications in electronic materials", IET Nanodielectrics, vol. 1, No. 1, 2018, pp. 17-31.

Wang et al., "Tactile-Sensing Based on Flexible PVDF Nanofibers via Electrospinning: A Review", Sensors, vol. 18, 330, 2018, pp. 1-16.

Stevens et al., "A Review of Adjustable lenses for Head Mounted Displays", International Society for Optics and Photonics, Proceedings of SPIE, vol. 10335, Digital Optical Technologies, Sep. 12, 2017, 20 pages.

Li et al., "Studies on the transformation process of PVDF from $\alpha$ to $\beta$ phase by stretching", RSC Advances, vol. 4, 2014, pp. 3938-3943.

Mohammadi et al., "Effect of tensile strain rate and elongation on crystalline structure and piezoelectric properties of PVDF thin films", Polymer Testing, vol. 26, 2007, pp. 42-50.

Lazarus et al., "Geometry-Induced Rigidity in Nonspherical Pressurized Elastic Shells", Physical Review Letters, vol. 109, No. 14, 2012, 6 pages.

Bonora et al., Active diffraction gratings: Development and tests, Review of Scientific Instruments, vol. 83, No. 12, Dec. 19, 2012, pp. 1-9.

"Manufacture of dichroics, areas of application and specifications", Technology, specifications and application of dichroic filters, URL: https://www.prinzoptics.de/en/technology-specifications-and-application-dichroic-filters, as accessed on 2018, pp. 1-24.

Kleinhans, W. A., "Aberrations of curved zone plates and Fresnel lenses", Applied Optics, vol. 16, No. 6, Jun. 1977, pp. 1701-1704.

Haertling, G. H., "Improved Hot-Pressed Electrooptic Ceramics in the (Pb,La)(Zr,Ti)O3 System", Journal of the American Ceramic Society, vol. 54, No. 6, Jun. 1971, pp. 1-19.

Jiang et al., "Transparent Electro-Optic Ceramics and Devices", Optoelectronic Devices and Integration, International Society for Optics and Photonics, Proceedings of SPIE, vol. 5644, 2004, 16 pages.

Kong et al., "Transparent Ceramic Materials", Transparent Ceramics, Topics in Mining, Metallurgy and Materials Engineering, 2015, pp. 29-91.

\* cited by examiner

TRANSPARENT TUNABLE OPTICAL ELEMENTS WITH STRUCTURALLY-MODIFIED ELECTROACTIVE POLYMER

BACKGROUND

Polymeric and other dielectric materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality and augmented reality eyewear devices or headsets, for instance, may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film electroactive materials, including the Poisson's ratio to generate a lateral deformation (e.g., lateral expansion or contraction) as a response to compression between conductive electrodes. Example virtual reality/augmented reality assemblies containing electroactive layers may include deformable optics, such as mirrors, lenses, or adaptive optics. Deformation of the electroactive polymer may be used to actuate optical elements in an optical assembly, such as a lens system.

Although very thin layers of many electroactive polymers and piezoceramics can be highly transparent, the achievable force or displacement output may limit their use to an application space that can be outside of system functional requirements. Thus, notwithstanding recent developments, it would be advantageous to provide polymeric or other dielectric materials having improved actuation characteristics, including a controllable and sufficient deformation response in an optically transparent package.

SUMMARY

As will be described in greater detail below, the instant disclosure relates to tunable optical elements and methods for forming tunable optical elements. The optical elements may include a transparent electroactive polymer and may be incorporated into a variety of device architectures.

In particular embodiments, a deformable optical element and an electroactive layer are co-integrated whereby the deformable optic may itself be actuatable. Tunable stiffness and electromechanical response, for instance, may be achieved via structural engineering of transparent electroactive materials either at the molecular level, e.g., through defect engineering and the introduction of heterogeneities, or on a macro-scale through non-planar forms and applied pre-strain. Using these and other approaches, the force and displacement of the resulting actuator can be modified to address the requirements of various optical applications.

In certain embodiments, structurally-modified electroactive polymers may be incorporated into an optical device that may include a liquid lens. However, it will be appreciated that although the current disclosure describes the structural modification of electroactive polymers and the attendant tunability of their mechanical and electromechanical properties in the context of liquid lenses, applications for such structurally-modified materials are not particularly limited, and the presently-disclosed materials and methods may be incorporated into additional deformable optic platforms.

In the present context, "structural modification," "structurally-modified," and the like may refer to the introduction or alteration of a physical feature or characteristic within a material layer at a micro- or macro-scale to affect one or more of the electrical, mechanical, or electromechanical properties of the layer and/or a device including the layer.

According to certain embodiments, an optical element may include a primary electrode, a secondary electrode overlapping at least a portion of the primary electrode, and a transparent, structurally-modified electroactive polymer layer disposed between and abutting the primary electrode and the secondary electrode. The structurally-modified electroactive polymer may include a piezoelectric polymer or an electrostrictive polymer. By way of example, the electroactive polymer may include a PVDF homopolymer, a P(VDF-TrFE) co-polymer, a P(VDF-TrFE-CFE) ter-polymer or a P(VDF-TrFE-CTFE) ter-polymer. In some embodiments, the structurally-modified electroactive polymer may have a transmissivity within the visible spectrum of at least approximately 20% and less than approximately 10% haze.

In certain embodiments, the optical element may include a multi-layer stack having a primary electrode, a secondary electrode, and a structurally-modified electroactive polymer disposed between the primary electrode and the secondary electrode, where the multi-layer stack has a unimorph architecture, a bi-morph architecture or a multi-morph architecture, for example.

In some embodiments, the structurally-modified electroactive polymer may include a planar or a non-planar layer and may be pre-stressed to exhibit a non-zero stress state when zero voltage is applied between the primary electrode and the secondary electrode. Dopants, nucleating agents, or other fillers may be incorporated into the structurally-modified electroactive polymer. Example filler materials include graphene, carbon nanotubes, hexagonal boron nitride, and oxide nanoparticles. In certain embodiments, filler particles may be distributed non-homogeneously throughout the structurally-modified electroactive polymer, e.g., along a direction extending from the primary electrode to the secondary electrode. According to some embodiments, a layer of the structurally-modified electroactive polymer may be at least partially crystalline, e.g., containing nanocrystalline domains. In some embodiments, the structurally-modified electroactive polymer may be at least partially hydrogenated and/or include molecular-level defects.

In some embodiments, an optical device may include a tunable lens and an optical element disposed over a first surface of the tunable lens. The tunable lens may be a liquid lens, for example, and may have a geometry selected from prismatic, freeform, plano, meniscus, bi-convex, plano-convex, bi-concave, or plano-concave. In certain embodiments, a further optical element may be disposed over a second surface of the tunable lens. The optical device may be incorporated into a head mounted display, e.g., within a transparent aperture thereof.

According to further embodiments, a method may include forming an electroactive polymer layer over a primary electrode, structurally modifying the electroactive polymer layer, and forming a secondary electrode over the electroactive polymer layer. In such a method, structurally modifying the electroactive polymer layer may include at least one of, e.g., two or more of, (a) applying stress to the electroactive polymer layer, (b) incorporating particles of a filler material within the electroactive polymer, (c) thermally annealing the electroactive polymer, (d) hydrogenating the electroactive polymer, and (e) irradiating the electroactive polymer layer. In certain embodiments, the primary electrode may be formed over a tunable lens. In some embodiments, the structurally-modified electroactive polymer layer may be transparent.

Features from any of these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
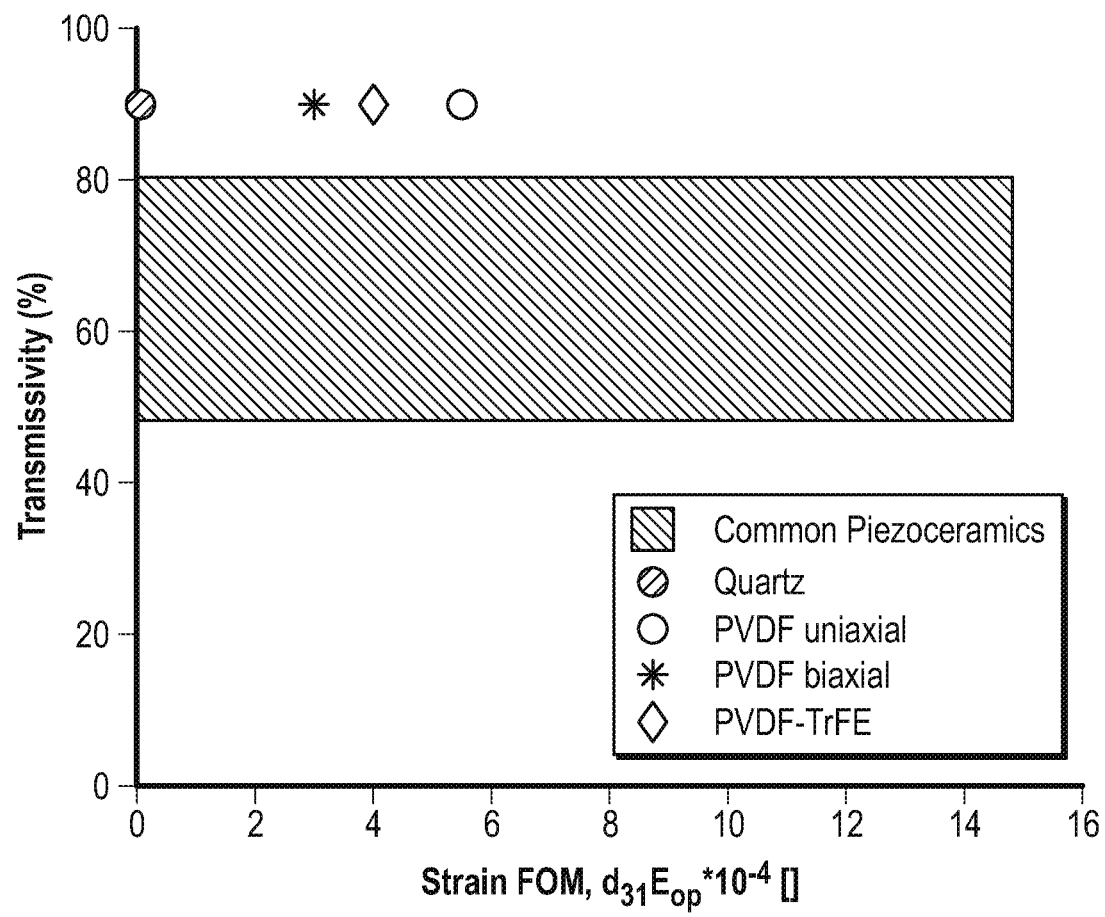
FIG. 1 is a plot showing a comparison of a modified strain figure of merit with transmissivity for example piezoelectric polymer and piezoceramic materials.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to optical elements, and more particularly to optical elements that include a structurally-modified electroactive polymer layer. The electroactive polymer layer may be capacitively actuated to deform the optical element and hence modify its optical performance. By way of example, the optical element may be located within the transparent aperture of a liquid lens, although the present disclosure is not particularly limited and may be applied in a broader context. By way of example, the optical element may be incorporated into an active grating, tunable lens, accommodative optical elements, or adaptive optics.

In accordance with various embodiments, molecular-level or macro-scale engineering of the electroactive polymer layer may be used to structurally modify the polymer matrix and impact its electromechanical response. For instance, in exemplary polymer materials, such as polyvinylidene fluoride (PVDF), the extent of the electromechanical response may be attributed to a degree of crystallinity within the polymer matrix. In this regard, various molecular-level methods are disclosed for forming crystalline domains without adversely impacting the transparency of the polymer material.

According to some embodiments, structural modification on a molecular scale may be achieved by introducing fillers, heterogeneities (e.g., nucleating agents) or dopants to a precursor composition used to form an electroactive polymer layer. Further methods include modification during or after curing via irradiation, hydrogenation, or thermal annealing at an elevated temperature.

At the macro-scale, the mechanical behavior, including the piezoelectric response, of an elastomeric layer may be improved by pre-tensioning the layer. Single-layer, bi-layer, and multi-layer architectures are disclosed, and may optionally include pre-strained elastomeric layers. By way of example, a pre-tensioned stack may be formed by a lamination process. In conjunction with such a process, a rigid frame may be used to maintain line tension within the polymer layer(s) during lamination. Further manufacturing methods for the optical element are disclosed, including the formation of a buckled layer by thermoforming about a mold, which may be used to achieve a desired piezoelectric response while potentially obviating the need for introducing (and maintaining) layer pre-tension. Also disclosed are various augmented reality stack designs and lens geometries based on a buckled layer or molded layer paradigms. For instance, an optical element may include a tunable lens having a variety of form factors, including prismatic, free-form, plano, meniscus, bi-convex, plano-convex, bi-concave, or plano-concave surfaces.

As will be explained in greater detail below, embodiments of the instant disclosure relate to an optical element that includes a primary electrode, a secondary electrode overlapping at least a portion of the primary electrode, and a transparent, structurally-modified electroactive polymer disposed between and abutting the primary electrode and the secondary electrode. An optical device may include a tunable lens and an optical element disposed over a surface of the tunable lens.

In accordance with various embodiments, an electroactive polymer may include a deformable polymer that may be symmetric with regard to electrical charge (e.g., polydimethylsiloxane (PDMS) acrylates, etc.) or asymmetric (e.g., poled polyvinylidene fluoride (PVDF) or its co-polymers such as poly(vinylidenefluoride-co-trifluoroethylene) (PVDF-TrFE)). Further PVDF-based polymer may include poly(vinylidene fluoride-trifluoroethylene-chlorofluoroethylene (P(VDF-TrFE-CFE)) or poly(vinylidenefluoride-trifluoroethylene-chlorotrifluoroethylene (P(VDF-TrFE-CTFE)). Additional examples of polymer materials forming electroactive polymers may include, without limitation, styrenes, polyesters, polycarbonates, epoxies, halogenated polymers, silicone polymers, and/or other suitable polymer materials. Such materials, according to some embodiments, may have a dielectric constant or relative permittivity, such as, for example, a dielectric constant ranging from approximately 1.2 to approximately 30.

Methods of forming a device having a structured electroactive polymer layer include forming electrodes and electroactive polymer layers sequentially (e.g., via vapor deposition, coating, printing, etc.) or simultaneously (e.g., via co-extrusion, slot die coating, etc.). As disclosed further herein, a co-extrusion process having a high drawing ratio may enable the formation of plural thin layers (e.g., electroactive polymer layers and electrode layers), which may be used to form a multi-morph architecture from a larger billet of electroactive, conductive, and optionally passive support materials. Alternatively, the electroactive layers may be extruded individually. As will be appreciated, co-extrusion may be compatible with molecular-level structural modifications, including the introduction of fillers, dopants, or heterogeneities that can be incorporated into the electroactive material before extrusion.

According to further embodiments, one or more layers of an electroactive polymer may be deposited using initiated chemical vapor deposition (iCVD) where, for example, suitable monomers of desired polymers may be used to form the polymer layer. In some embodiments, monomers, oligomers, and/or pre-polymers for forming the electroactive polymer layers may optionally be mixed with a solvent and the solvent may be removed from the electroactive polymer layer during and/or following curing.

In the presence of an electrostatic field (E-field), an electroactive polymer (e.g., a structurally-modified electroactive polymer) may deform (e.g., compress, elongate, bend, etc.) according to the magnitude and direction of the applied field. Generation of such a field may be accomplished, for example, by placing the electroactive polymer between two electrodes, e.g., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

In some embodiments, the electroactive polymer (e.g., a structurally-modified electroactive polymer) may have an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.05 GPa, including ranges between any of the foregoing values).

According to various embodiments, an optical element may include a layer of a structurally-modified electroactive polymer where capacitive actuation of the polymer layer may be used to modify one or more optical properties of the optical element. The optical element may be partially or fully transparent, for example, and may be disposed within the transparent aperture of a device such as a liquid lens.

Liquid lenses can be used to enhance imaging system flexibility across a wide variety of applications that benefit from rapid focusing. According to certain embodiments, by integrating an actuatable liquid lens, an imaging system can rapidly change the plane of focus to provide a sharper image, independent of an object's distance from the camera. The use of liquid lenses may be particularly advantageous for applications that involve focusing at multiple distances, where objects under inspection may have different sizes or may be located at varying distances from the lens, such as package sorting, barcode reading, security, and rapid automation, in addition to virtual reality/augmented reality devices.

Figure 3:
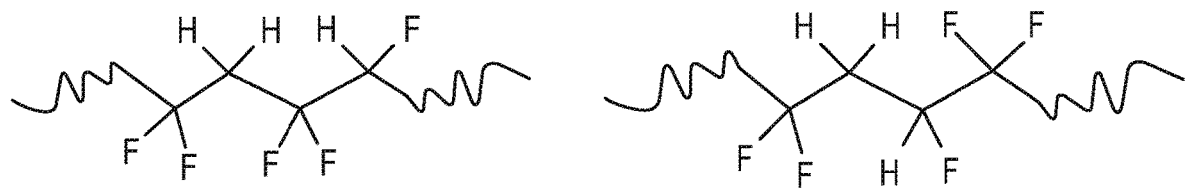
FIG. 3 is a schematic diagram showing the molecular structure of direct co-polymerized P(VDF-CTFE) and hydrogenated P(VDF-CTFE) according to some embodiments.
Figure 4:
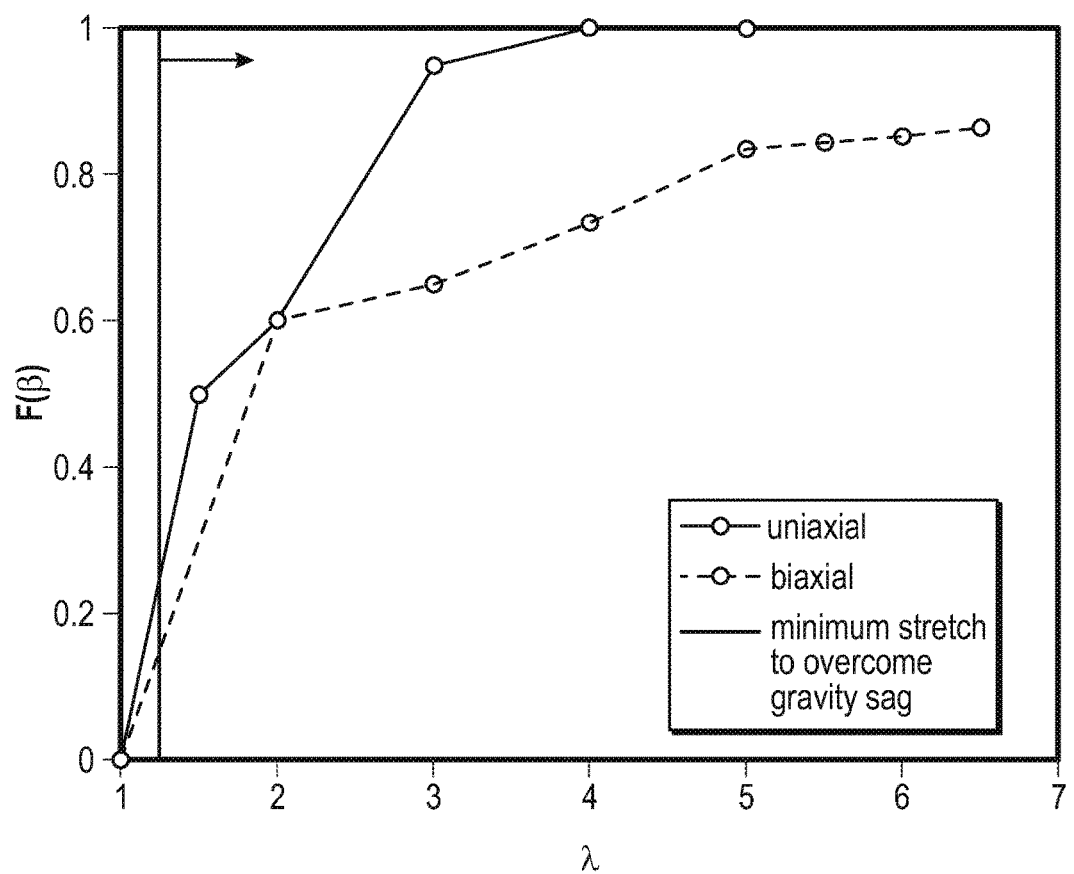
FIG. 4 is a plot showing the relative fraction of β-phase PVDF as a function of stretch ratio for uniaxial and biaxial stretch in comparison to the minimum stretch to overcome gravity sag according to certain embodiments.
Figure 5:
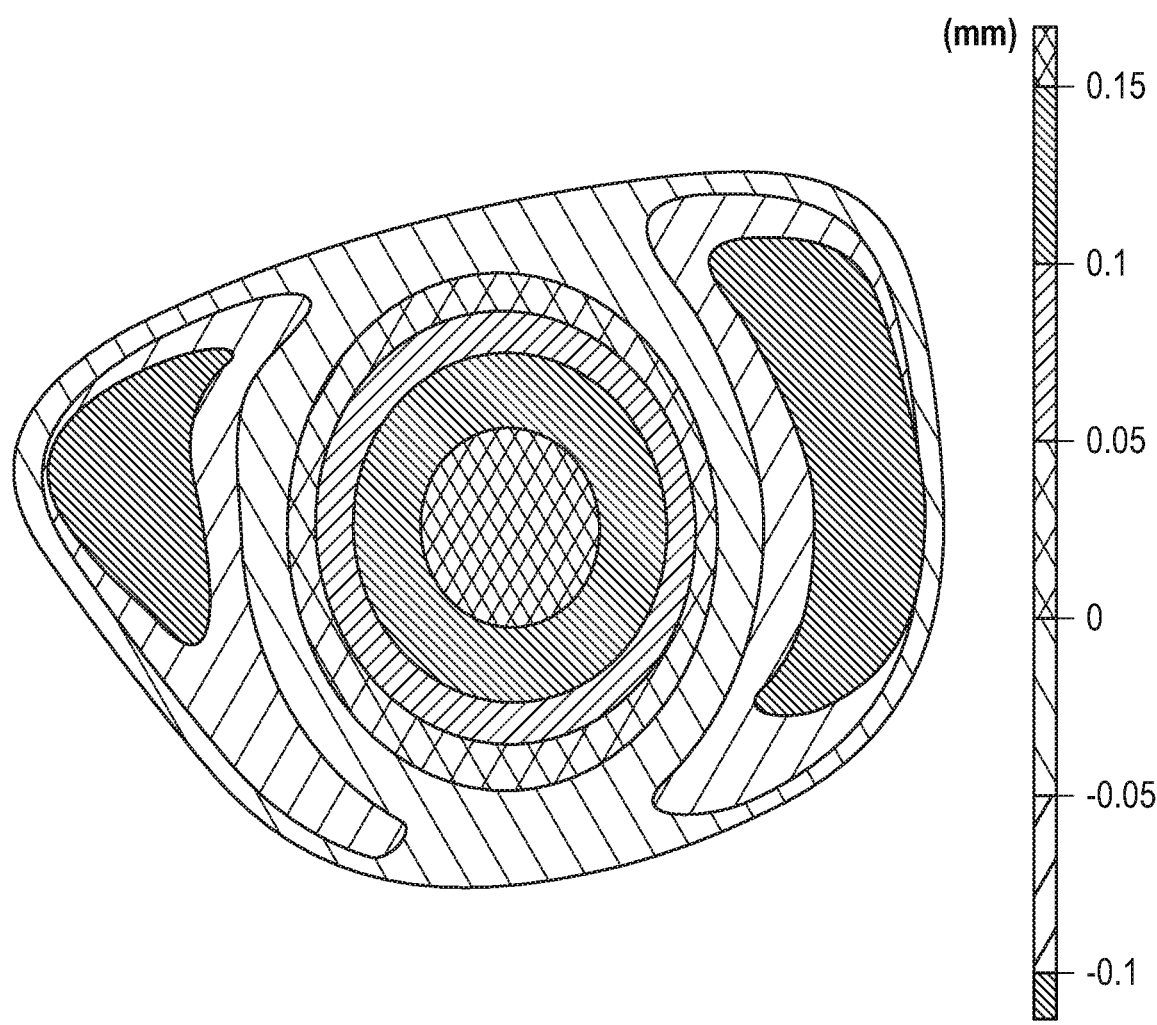
FIG. 5 is a deformation profile for uniaxially-oriented PVDF in an example eye shape according to some embodiments.
Figure 6:
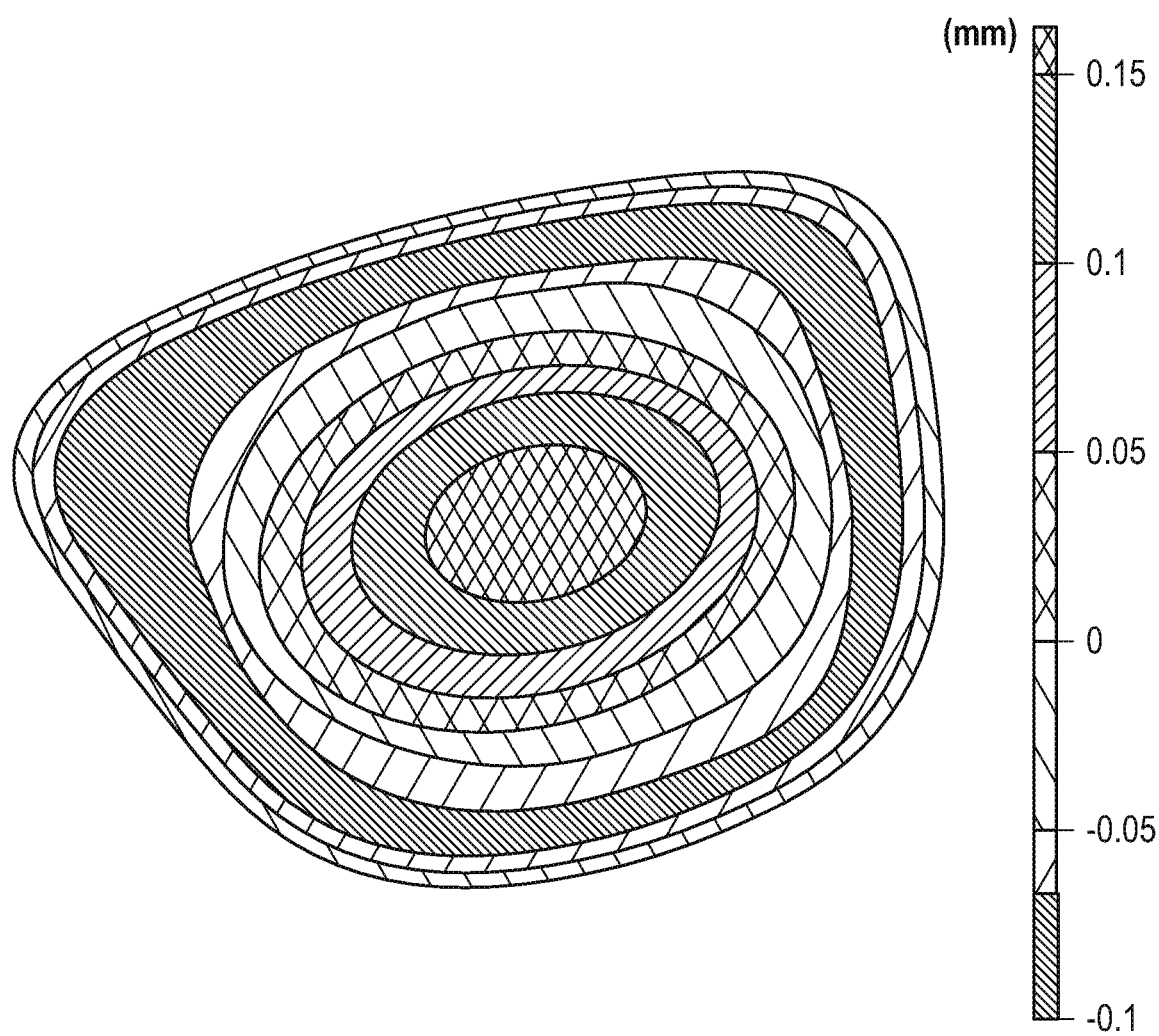
FIG. 6 is a deformation profile for biaxially-oriented PVDF in an example eye shape according to some embodiments.

The following will provide, with reference to FIGS. 1-26, a detailed description of methods, systems, and apparatuses for forming actively tunable optical elements that include a structurally-modified electroactive polymer and exhibit partial or complete transparency. The discussion associated with FIG. 1 and FIG. 2 includes a description of modified strain and force figures of merit compared to transmissivity for various piezoelectric polymers and piezoceramics. The discussion associated with FIG. 3 includes a description of the molecular structure of direct co-polymerized P(VDF-CTFE) and hydrogenated P(VDF-CTFE). FIG. 4 illustrates the relative fraction of β-phase PVDF as a function of stretch ratio for uniaxial and biaxial stretch compared to the minimum stretch needed to overcome gravity sag. FIG. 5 and FIG. 6 illustrate deformation profiles for uniaxially- and biaxially-oriented PVDF in example eyeshapes.

Figure 14:
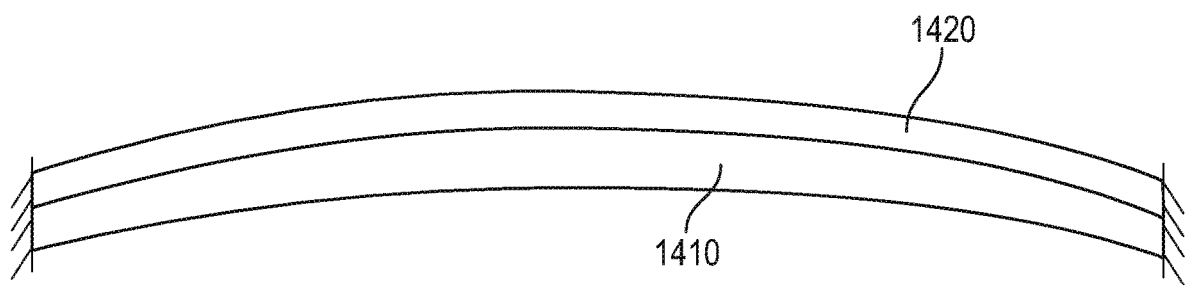
FIG. 14 illustrates an exemplary buckled layer design according to some embodiments.
Figure 15:
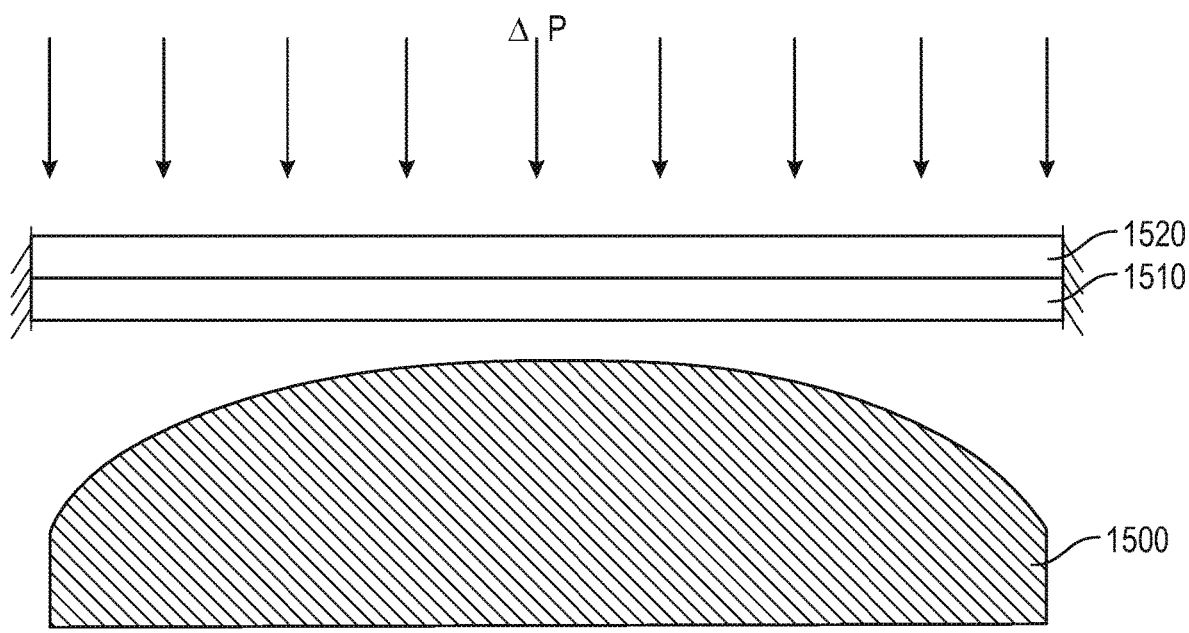
FIG. 15 is a schematic diagram illustrating a thermoforming process for manufacturing a liquid lens having a shell geometry according to various embodiments.
Figure 16:
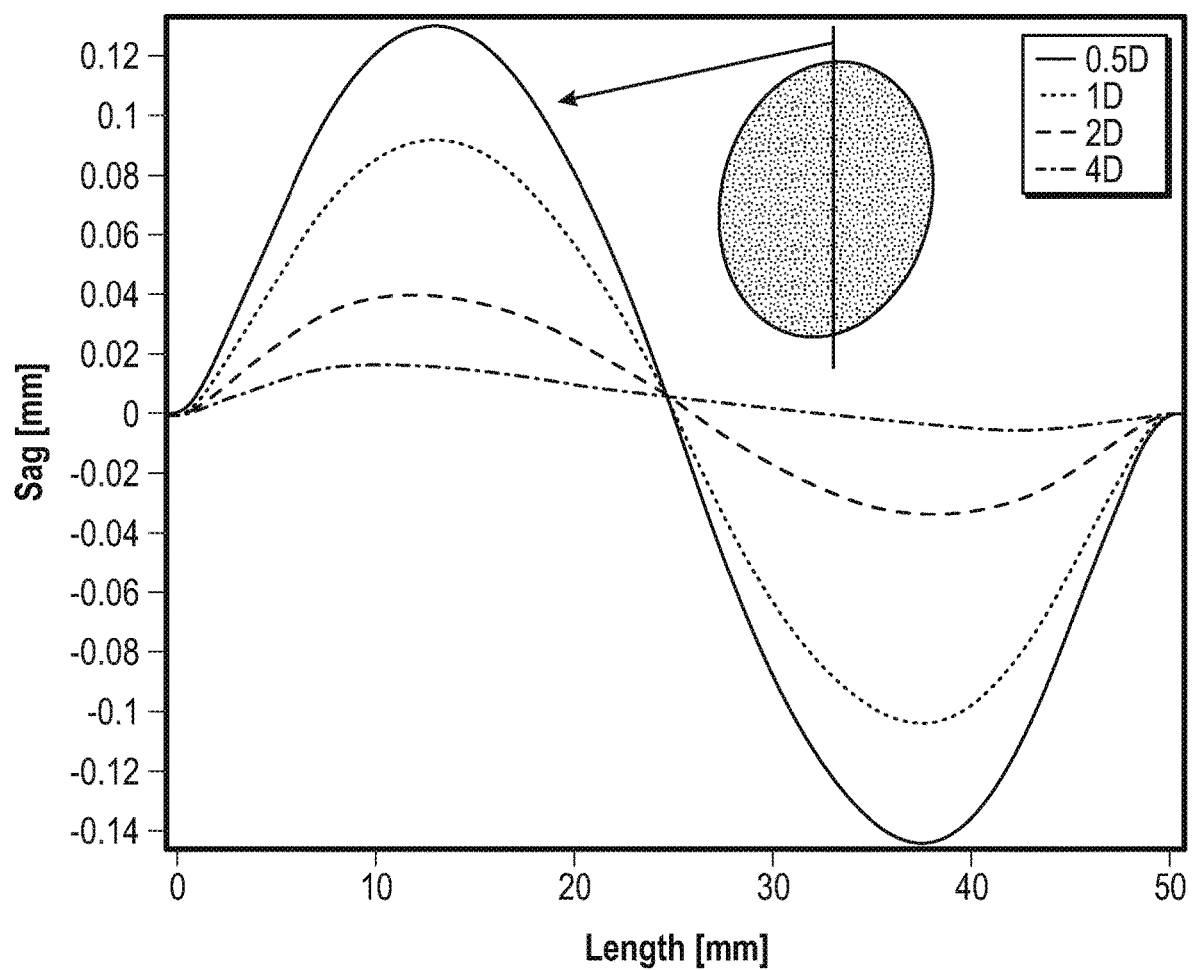
FIG. 16 is a centerline plot showing the effect of curvature on gravity sag for a PVDF thin film according to some embodiments.

The discussion associated with FIGS. 7-10 includes a description of example structurally-modified electroactive polymer-containing multi-layer stack geometries. The discussion associated with FIG. 11 and FIG. 12 describes a manufacturing process for fabricating a pre-tensioned stack of two or more electroactive polymer layers and the resulting laminate structure, respectively. The discussion associated with FIG. 13 includes a description of a compressive stress-strain curve for a buckling plate. The discussion associated with FIG. 14 describes a buckled or shell layer design including a structurally-modified electroactive polymer layer. FIG. 15 illustrates a thermoforming process for manufacturing a shell geometry. FIG. 16 is a centerline plot of gravity sag for a circular aperture with variable surface curvature. The discussion associated with FIG. 17 describes a plot showing maximum gravity sag as a function of surface optical power for various electroactive polymer layer thicknesses.

Figure 18:
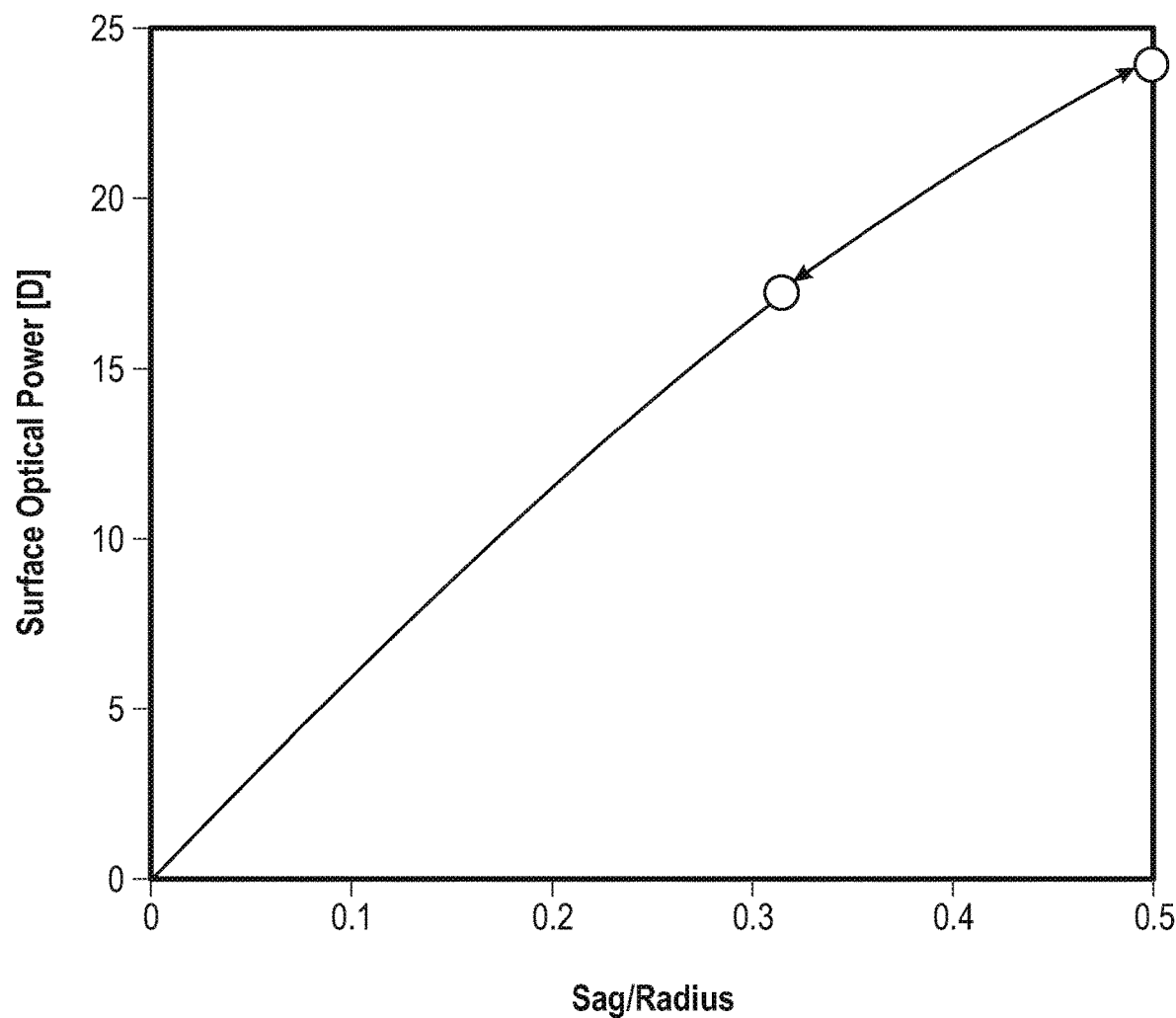
FIG. 18 is a plot of optical power for a spherical surface as a function of the ratio of surface sag to aperture radius according to some embodiments.
Figure 22:
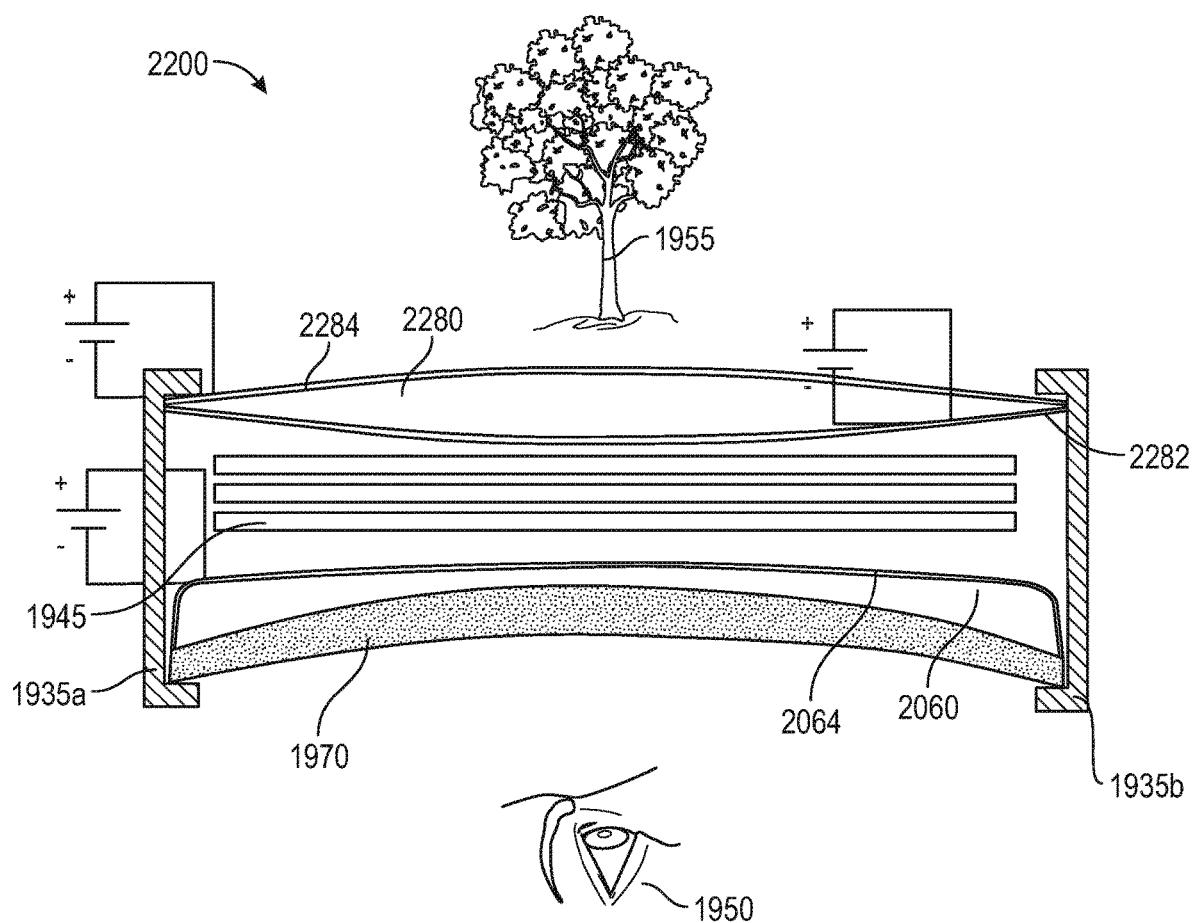
FIG. 22 is a schematic diagram of the augmented reality device stack design of FIG. 21 in an actuated state according to some embodiments.
Figure 23:
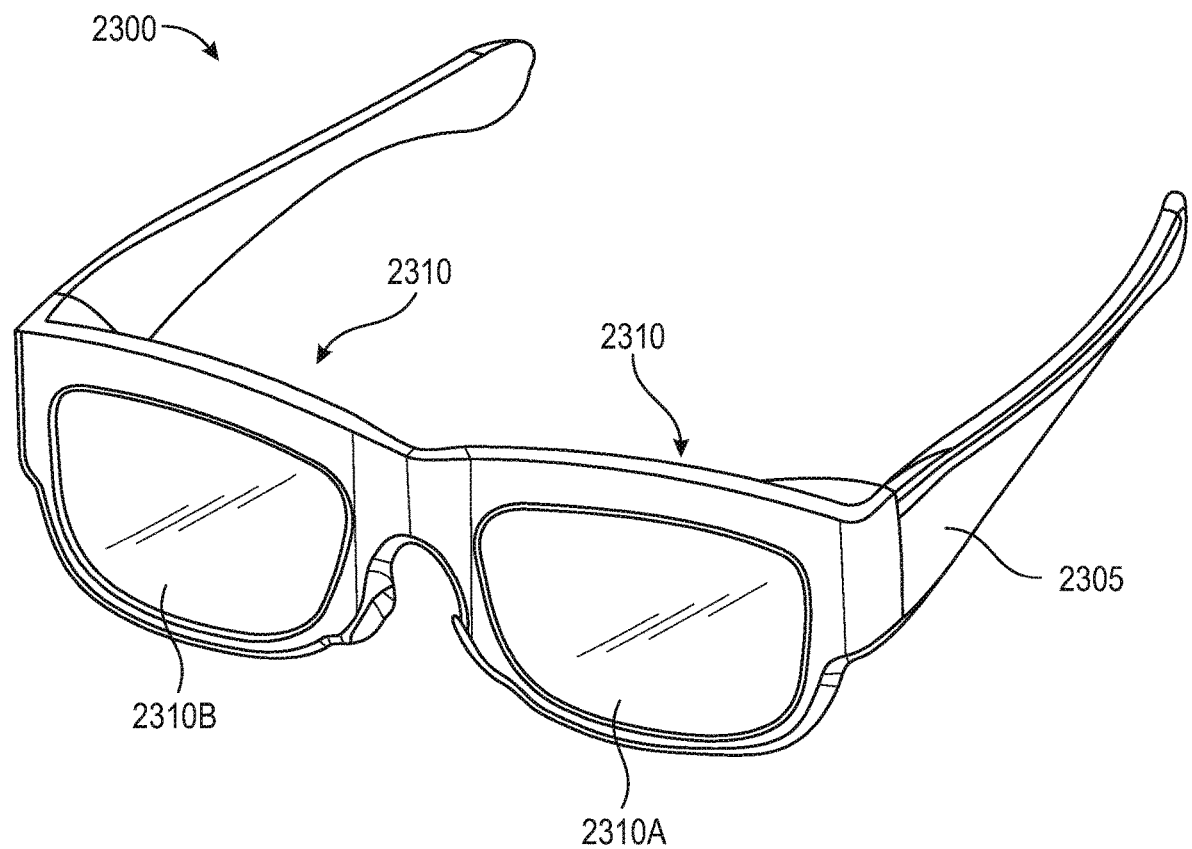
FIG. 23 is a schematic illustration of an example head-mounted display.

The discussion associated with FIG. 18 describes a plot showing surface optical power of a spherical surface as a function of the ratio of surface sag to aperture radius. The discussion associated with FIGS. 19-22 relates to example augmented reality device stack designs having one or more layers of a structurally-modified electroactive polymer. FIG. 23 shows a schematic illustration of a head-mounted display. The discussion associated with FIGS. 24-26 relates to exemplary virtual reality and augmented reality device architectures that may include an optical element having a structurally-modified and at least partially-transparent electroactive polymer layer.

According to various embodiments, "transparent" or "optically transparent" electroactive polymers have a transmissivity within the visible light spectrum of at least approximately 20%, e.g., 20, 30, 40, 50, 60, 70, 80, 90 or 95%, including ranges between any of the foregoing values, and less than approximately 10% haze, e.g., 0, 1, 2, 4, 6, or 8% haze, including ranges between any of the foregoing values.

Figure 2:
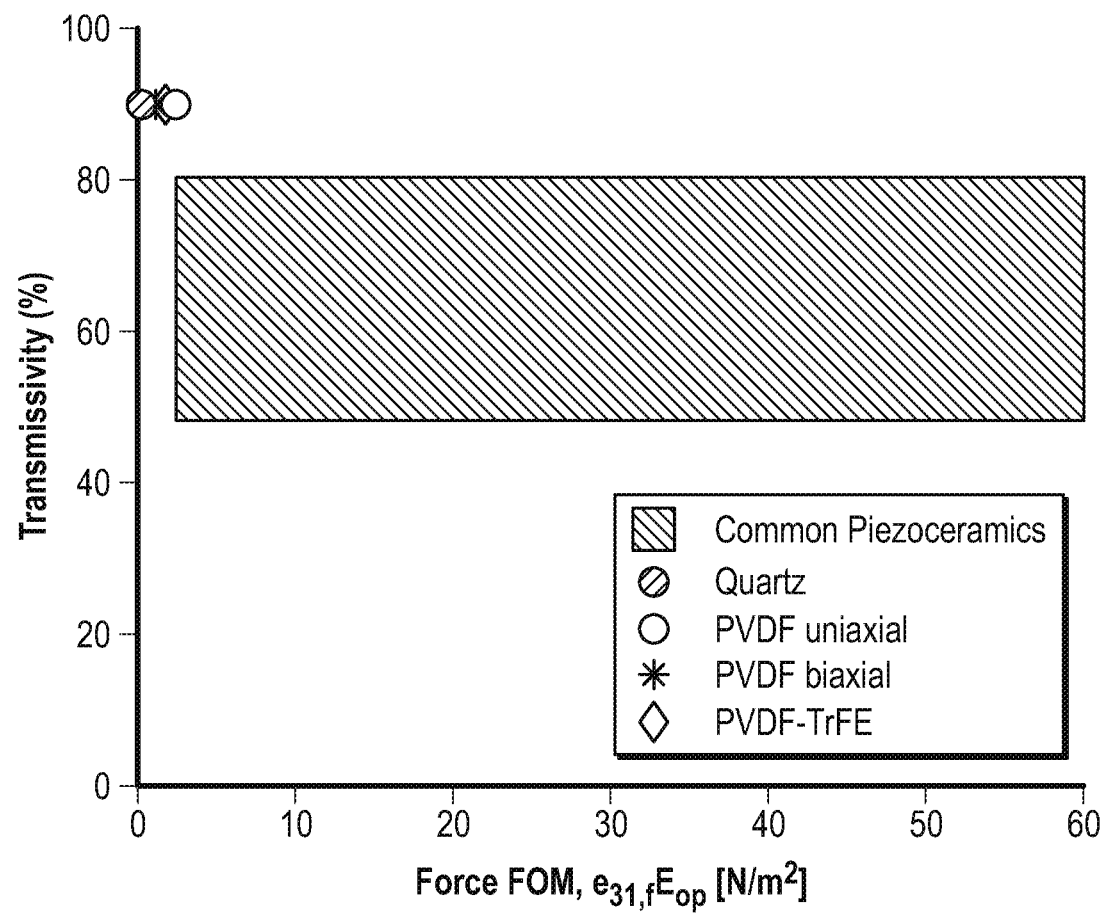
FIG. 2 is a plot showing a comparison of a modified force figure of merit with transmissivity for example piezoelectric polymer and piezoceramic materials.

Electroactive polymers can be highly transparent compared to traditional piezoceramics. However, common piezoelectric polymers, like PVDF and its co-polymers, typically exhibit poorer performance in terms of both strain and force output. With reference to FIGS. 1 and 2, shown is the optical transmissivity compared to modified strain and force figures of merit (FOM), respectively, for common piezoelectric polymers and piezoceramics.

Typically, the strain and force FOMs are defined by the piezoelectric charge (or strain) constant d and piezoelectric stress constant e. Because the induced stress and strain are also a function of an applied electric field, the magnitude of the operating electric field may vary greatly between piezoelectric polymers and ceramics. Thus, to provide a more realistic comparison, the FOMs in FIGS. 1 and 2 are modified with an appropriate operating electric field. From FIGS. 1 and 2, it is evident that a fundamental trade-off may be encountered between transmissivity and electromechanical response in both strain and force for these materials.

Notwithstanding possible limitations in force and displacement, PVDF and its co-polymers remain attractive actuation options given their relatively high optical transparency and comparative ease and low cost of manufacture. In this regard, Applicants have shown that structural modifications of electroactive polymers, including PVDF, on the micro- and macro-scales, have the potential to improve electromechanical response without compromising optical clarity or manufacturability.

On a molecular level, for instance, the electromechanical response of semi-crystalline PVDF, as well as its co-polymer and ter-polymer forms, may be attributed to the presence of crystalline domains within the polymer matrix. According to some embodiments, defect engineering via x-ray irradiation may be used to promote localized crystallization, which has been shown to more than approximately double the electromechanical response of PVDF-TrFE. In certain embodiments, crystallinity may be induced in PVDF-based polymers by x-ray irradiation at doses up to approximately 100 kGy. According to further embodiments, irradiation may create molecular-level defects within the electroactive layer, such as topological defects, cyclic defects, and/or elastically-defective polymer chains.

Furthermore, according to some embodiments, thermal annealing can be used to form crystalline nanodomains resulting in an increased dielectric constant and dielectric breakdown strength. For instance, PVDF-based polymers may be at least partially crystallized by heating below their melting temperature range, e.g., at an annealing temperature of from approximately 90° C. to approximately 160° C.

Example structurally-modified electroactive polymers may, according to some embodiments, include from approximately 5% by volume to approximately 50% by volume of a crystalline phase, e.g., 5, 10, 20, 30, 40, or 50 vol. % crystallinity, including ranges between any of the foregoing values. Furthermore, regions of crystallinity, i.e., crystalline domains, may be two-dimensional or three-dimensional and may have a characteristic dimension (i.e., length, width and/or depth) of approximately 5 nm to approximately 500 nm, e.g., 5, 10, 20, 50, 100, 200 or 500 nm, including ranges between any of the foregoing values.

For piezoelectric polymers like PVDF homopolymer, the piezoelectric response may be tuned by altering the crystalline content and the crystalline orientation within the polymer matrix, e.g., by uniaxial or biaxial stretching, optionally followed by poling. The origin of piezoelectricity in PVDF homopolymer is believed to be the β-phase crystallite polymorph, which is the most electrically active and polar of the PVDF phases. Alignment of the β-phase structure may be used to achieve the desired piezoelectric effect. Poling may be performed to align the β-phase and enhance the piezoelectric response. Other piezoelectric polymers, such as PVDF-TrFE and PVDF-TrFE-CFE may be suitably oriented upon formation and the piezoelectric response of such polymers may be improved by poling with or without stretching.

Distinct from semi-crystalline polymers, charges can be trapped along amorphous/crystalline boundaries inducing polarization effects that increase permittivity. Thus, structural engineering of electroactive polymer materials according to some embodiments, may include the addition of a plasticizer, such as di-(2-ethylhexyl) phthalate (DEHP), which can promote dipole formation at these heterogeneities resulting in increased mobility and electromechanical response.

According to further embodiments, hydrogenation of PVDF-based polymer may create head-to-head connections in the co-polymer as opposed to a head-to-tail orientation from direct copolymerization. The head-to-head alignment may increase crystallinity, resulting in a high remnant and saturated polarization and increased dielectric permittivity. Referring to FIG. 3, shown is the molecular structure associated with direct copolymerization of P(VDF-CTFE), having a head-to-tail alignment (left), compared to the structure for hydrogenated P(VDF-CTFE), having a head-to-head orientation (right).

As will be appreciated, amorphous polymers are typically more transparent than those with a high degree of crystallinity, where transparency may be inhibited by scattering between amorphous and crystalline domain boundaries. In some embodiments, molecular-level modifications to achieve enhanced electromechanical effects may rely on increasing crystalline content and the associated presence of additional phase boundaries, which may be in opposition to maintaining transparency. However, it has been shown that the relative change in composition and crystallinity required to realize measurable effects in electromechanical response can be small compared to the degree of crystallinity required to significantly reduce transmissivity. For example, a crystallinity variation of up to approximately 15%, e.g., induced by thermal annealing, may yield an approximately 50% increase in electric field breakdown strength, with lower crystallinity preferable for high electrostriction constants. With nano-crystallinity induced by x-ray irradiation, the enhanced electromechanical effect may be attributed to both reorientation of crystallites and new crystallization.

For various molecular-level modifications, including those described above, selective control of the extent of the modification through patterning, masking, etc., can result in spatially-varied electromechanical properties, which may be advantageous for achieving a desired deformation profile for high optical quality. That is, in some embodiments, a masking layer may be formed over a portion of an electroactive polymer layer and patterned to expose selected regions of the layer. A process for structurally-modifying the polymer layer within exposed regions (e.g., exposure to x-ray irradiation) may then be performed selectively with respect to unexposed regions that are blocked by the masking layer. Following structural modification, remaining portions of the masking layer may be removed. A masking layer may include silicon dioxide, for example, which may be deposited, patterned, and removed using conventional photolithography techniques.

According to certain embodiments, crystalline alignment and an attendant improvement in electromechanical performance may be achieved through stretching, either uniaxially or biaxially, thermal annealing, poling, the addition of fillers that function as nucleating agents, or through modification of surface charges. Example nucleating agents include graphene, carbon nanotubes, hexagonal boron nitride, and oxide nanoparticles.

In accordance with further embodiments, and in the context of a liquid lens design, an elastomeric layer may be pre-tensioned to inhibit the coma induced by gravity sag. Referring to FIG. 4, shown is the relative fraction of β-phase PVDF as a function of stretch ratio for uniaxial and biaxial stretch compared to the minimum amount of stretch required to achieve an acceptably low gravity sag.

A benefit of pre-loading to achieve β-phase alignment is a gravity sag-resistant layer. In some embodiments, the implementation of a pre-load may represent a compromise between an improvement of the piezoelectric response and the increased force that may be required for actuation due to the higher tension. In some embodiments, a PVDF homopolymer may have a pre-stretch of approximately 20% to approximately 100%, e.g., 20, 30, 40, 50, 60, 70, 80, 90 or 100%, including ranges between any of the foregoing values. Although not required to achieve the β-phase as with the homopolymer PVDF, in various embodiments, pre-loading across any of the foregoing ranges can also be applied to co-polymer P(VDF-TrFE) and terpolymer P(VDF-TrFE-CFE) to tune piezoelectric and electrostrictive material properties, respectively.

The deformation profile in a practical liquid lens eyeshape of a bimorph PVDF architecture in uniaxial and equi-biaxial orientations is depicted in FIGS. 5 and 6, respectively. The uniaxial and equi-biaxial orientations exhibit a comparable maximum displacement, which may be attributed to the asymmetric nature of the eyeshape.

Although not demonstrated by the uniaxial and biaxial orientations, an axisymmetric deformation profile, which may be more advantageous for certain applications, may be achieved by applying a non-equi-biaxial stretch with a different pre-strain along each planar axis. For a circular or substantially circular aperture, a biaxially oriented electroactive polymer layer with uniform in-plane piezoelectric constants may be more appropriate for axisymmetric deformation.

As will be appreciated, the methods and systems shown and described herein may be used to form electroactive devices having a single layer or multiple layers of a structurally-modified electroactive polymer (e.g., a few layers to tens, hundreds, or thousands of stacked layers). For example, an electroactive device may include a stack of from two electroactive polymer elements and corresponding electrodes to thousands of electroactive polymer elements (e.g., approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer elements, including ranges between any of the foregoing values). A large number of layers may be used to achieve a high displacement output, where the overall device displacement may be expressed as the sum of the displacement of each layer. Such complex arrangements can enable compression, extension, twisting, and/or bending when operating the electroactive device.

Example bimorph, unimorph and multi-morph configurations of a multi-layer stack containing one or more structurally-modified electroactive polymer layers are illustrated schematically in FIGS. 7-10. In the various stack geometries, referring first to FIG. 7, a primary electroactive polymer layer 710 may be disposed between a primary electrode 701 and a secondary electrode 702. According to some embodiments, an electroactive device (i.e., optical element) 700 may include a primary electrode 701, a secondary electrode 702 overlapping at least a portion of the primary electrode 701, and an electroactive polymer layer 710 disposed between and abutting the primary electrode 701 and the secondary electrode 702.

A secondary electroactive polymer layer 720 may be disposed over the primary electroactive polymer layer 710, e.g., directly over the secondary electrode 702, and a tertiary electrode 703 may be disposed over the secondary electroactive polymer layer 720 such that the secondary electroactive polymer layer 720 may be disposed between the secondary electrode 702 and the tertiary electrode 703.

Figure 7:
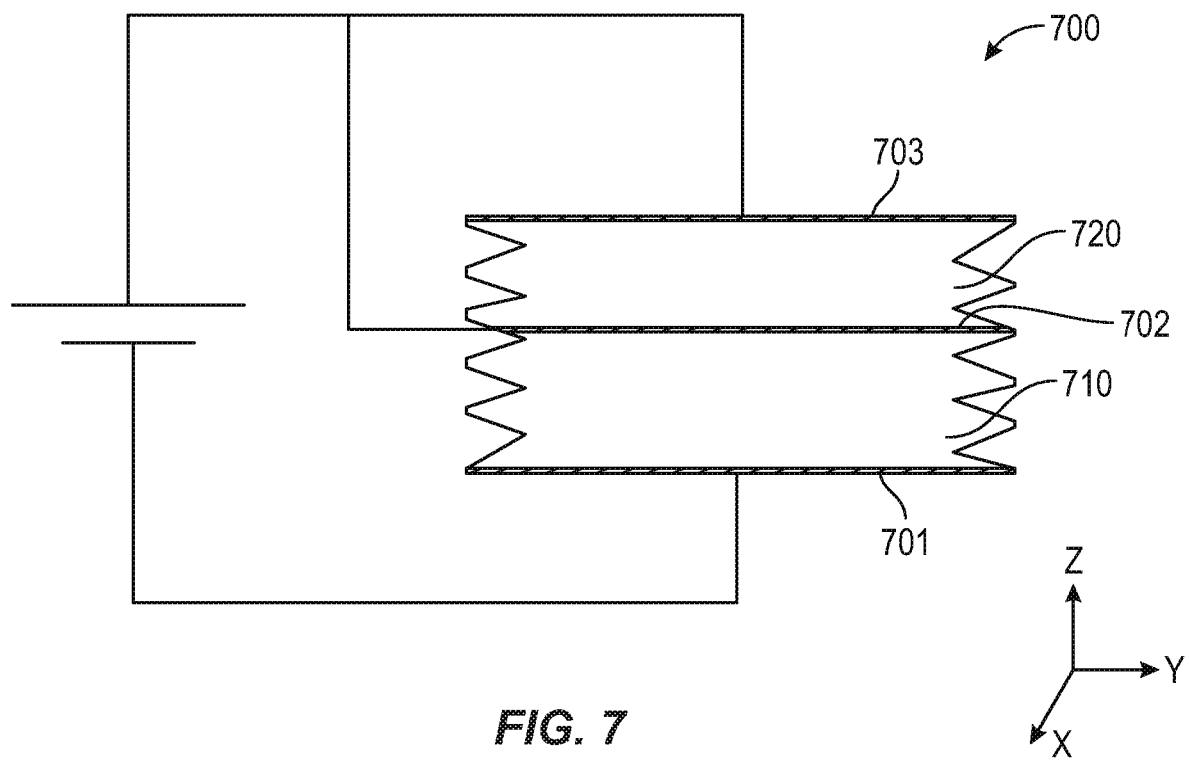
FIG. 7 is a schematic diagram of a multi-layer stack in a bimorph configuration according to certain embodiments.

In the bimorph geometry of FIG. 7, according to some embodiments, the primary electroactive layer 710 (e.g., structurally-modified electroactive layer 710) and the secondary electroactive layer 720 (e.g., structurally-modified electroactive layer 720) may be independently biased, i.e., by applying a voltage between respective electrode pairs, to produce a desired net displacement. In one example, the primary and secondary electroactive layers 710, 720 may be alternately compressed and expanded to produce bending deformation.

Figure 8:
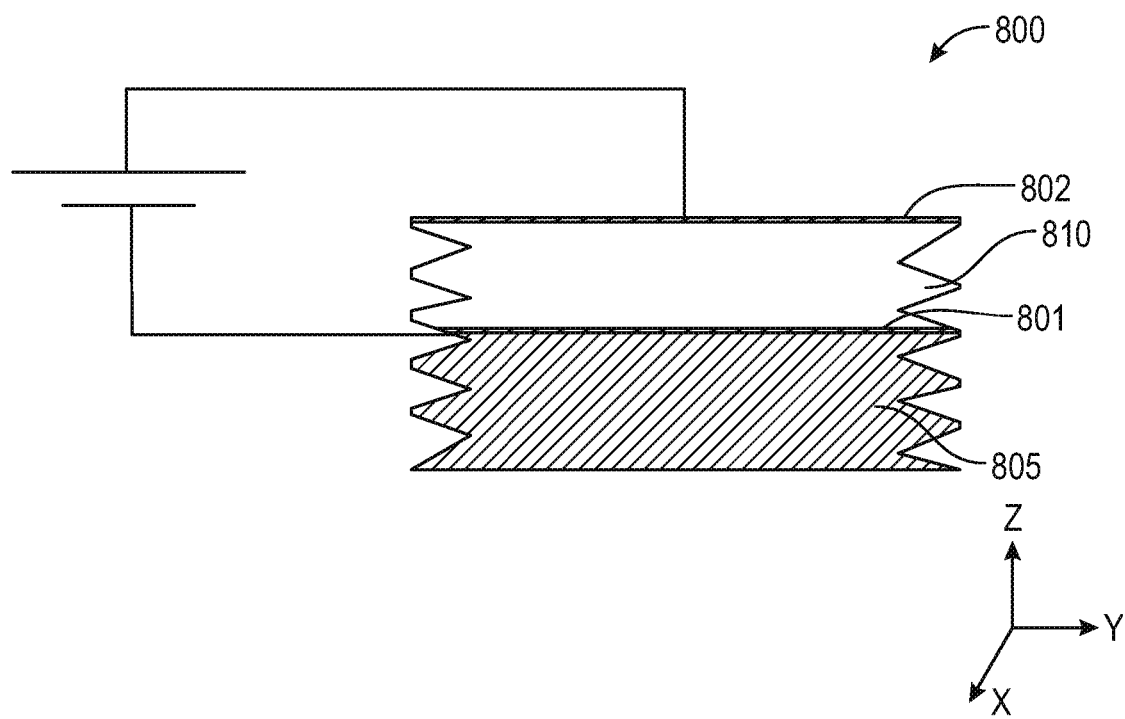
FIG. 8 is a schematic diagram of a multi-layer stack in a unimorph configuration according to certain embodiments.

With reference to FIG. 8, according to some embodiments, deformation kinetics can be achieved with a unimorph geometry. In the embodiments of FIG. 8, an electroactive device 800 (i.e., optical element) may include a primary electroactive layer 810 disposed over a passive substrate 805 and between a primary (lower) electrode 801 and a secondary (upper) electrode 802. The primary electroactive layer 810 (e.g., structurally-modified electroactive layer 810) can be capacitively actuated to induce bending, for example.

Figure 9:
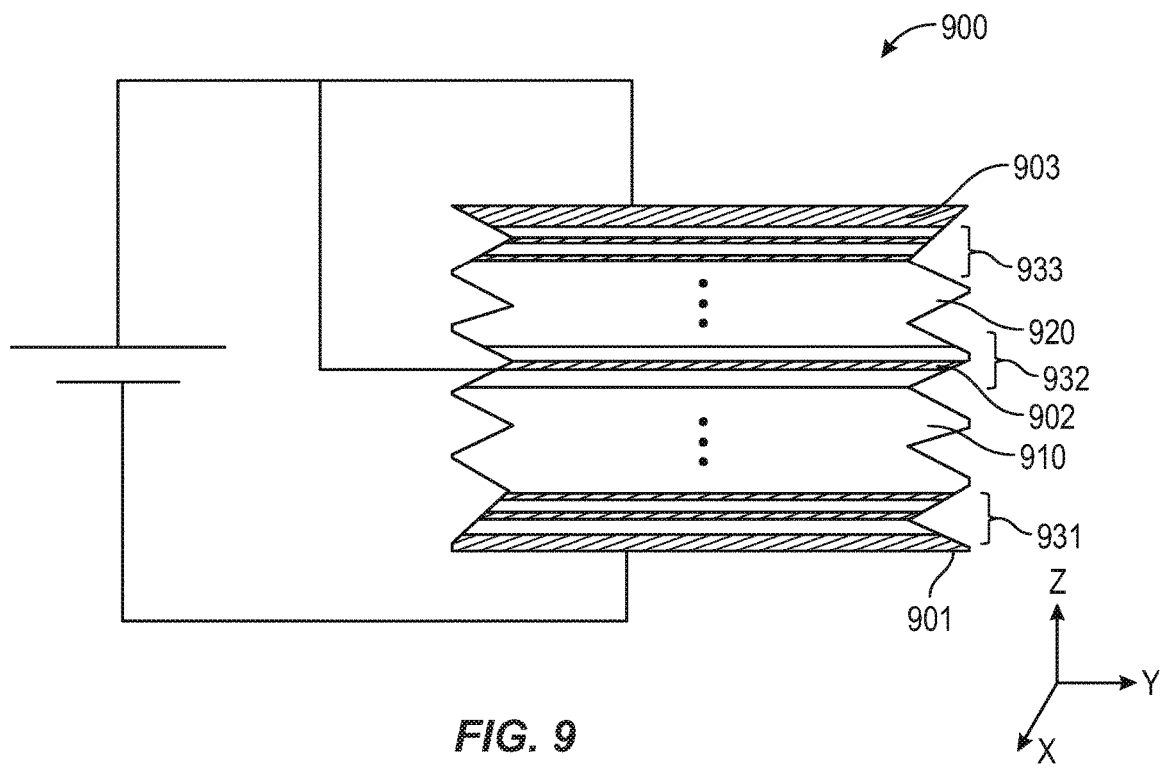
FIG. 9 is a schematic diagram of a multi-layer stack in a multi-morph architecture based on a bimorph configuration according to some embodiments.
Figure 10:
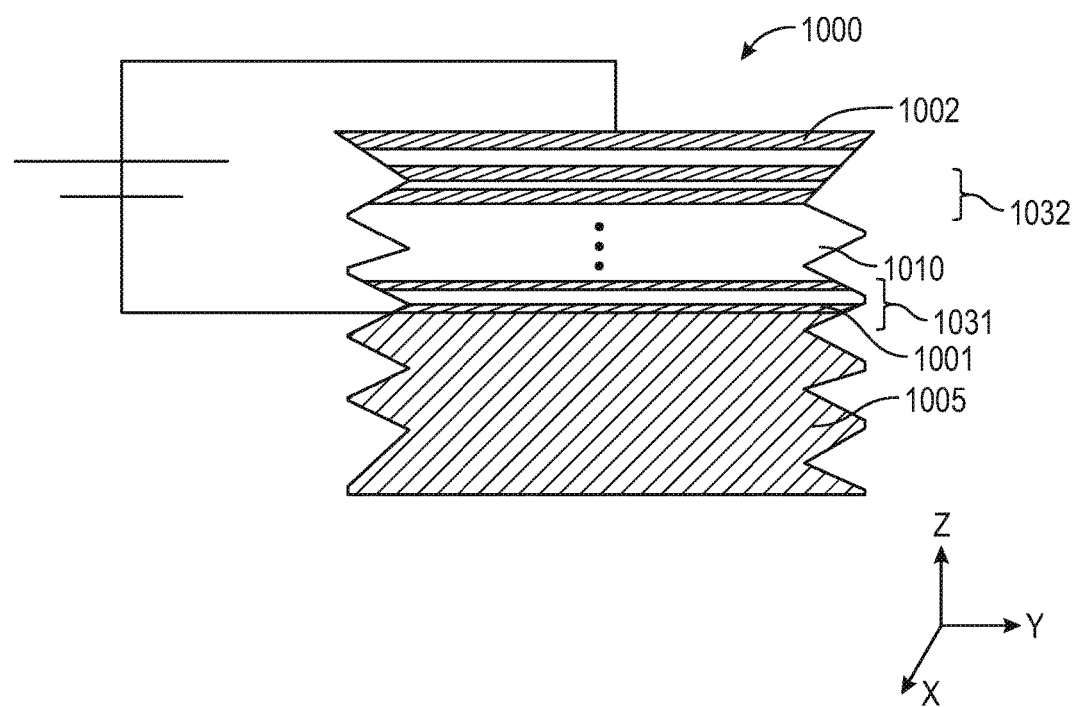
FIG. 10 is a schematic diagram of a multi-layer stack in a multi-morph architecture based on a unimorph configuration according to some embodiments.

Variations of bimorph and unimorph structures, according to some embodiments, may include additional active and inactive layers, such as one or more additional electroactive polymer layers, for example, and one or more additional electrodes (or electrode pairs). Examples of such multi-morph architectures are shown in FIGS. 9 and 10. For clarity, the additional active and inactive layers are shown collectively in FIGS. 9 and 10 as stacks 931, 932, 933, 1031 and 1032.

Referring to FIG. 9, according to some embodiments, deformation kinetics can be achieved with a multi-morph geometry based on a bimorph architecture. In the embodiment of FIG. 9, a primary electroactive polymer layer 910 (e.g., structurally-modified electroactive layer 910) may be disposed between a primary electrode 901 and a secondary electrode 902. A secondary electroactive polymer layer 920 (e.g., structurally-modified electroactive layer 920) may be disposed over the primary electroactive polymer layer 910, e.g., over the secondary electrode 902, and a tertiary electrode 903 may be disposed over the secondary electroactive polymer layer 920 (e.g., structurally-modified electroactive layer 920) such that the secondary electroactive polymer layer 920 is disposed between the secondary electrode 902 and the tertiary electrode 903.

Further active and inactive layers may be incorporated into the electroactive device 900 (i.e., optical element) of FIG. 9. For instance, a stack 931 of active and/or inactive layers may be disposed between the primary electrode 901 and the primary electroactive layer 910, a stack 932 of active and inactive layers may be disposed between the primary electroactive layer 910 and the secondary electroactive polymer layer 920, and/or a stack 933 of active and inactive layers may be disposed between the secondary electroactive polymer layer 920 and the tertiary electrode 903. In some embodiments, one or more of the layers within stacks 931, 932, 933 may include a structurally-modified electroactive layer.

With reference to FIG. 10, according to some embodiments, deformation kinetics can be attained with a multi-morph geometry based on a unimorph architecture. The electroactive device 1000 (i.e., optical element) of FIG. 10 may include a primary structurally-modified electroactive layer 1010 disposed over a passive substrate 1005 and between a primary (lower) electrode 1001 and a secondary (upper) electrode 1002. Additional active and/or inactive layers may include alternating structurally-modified electroactive polymer layers and electrodes. For instance, a stack 1031 of active and inactive layers may be disposed between the substrate 1005 and the primary electroactive layer 1010 and a stack 1032 of active and/or inactive layers may be disposed between the primary electroactive layer 1010 and the secondary electrode 1002.

In certain embodiments, multi-morph structures with many layers based on bimorph and unimorph architectures may have the advantage of requiring lower electric fields for actuation insomuch as force output scales with the electric field for piezoelectrics and the square of the electric field for electrostrictive materials and dielectric elastomers.

In some embodiments, a structurally-modified electroactive polymer layer, for example electroactive polymer layers 710, 720, 810, 910, 920, 1010, etc. may have a thickness of approximately 10 nm to approximately 100 µm (e.g., approximately 10 nm, approximately 20 nm, approximately 50 nm, approximately 100 nm, approximately 200 nm, approximately 500 nm, approximately 1000 nm, approximately 2000 nm, approximately 5000 nm, approximately 10,000 nm, approximately 20,000 nm, approximately 50,000 nm, or approximately 100,000 nm, including ranges between any of the foregoing values), with an example thickness of approximately 200 nm to approximately 500 nm.

The electrodes (e.g., the primary electrode and the secondary electrode) may include metals such as aluminum, gold, silver, tin, copper, indium, gallium, zinc, and the like. Other conductive materials may be used, including carbon nanotubes, graphene, silver nanowires, transparent conductive oxides (TCOs, e.g., indium tin oxide (ITO), zinc oxide (ZnO), etc.), and the like.

In some embodiments, the electrodes (e.g., the primary electrode and the secondary electrode) may have a thickness of approximately 1 nm to approximately 1000 nm, with an example thickness of approximately 10 nm to approximately 50 nm. Some of the electrodes may be designed to allow healing of electrical breakdown (e.g., associated with the electric breakdown of elastomeric polymer materials). A thickness of an electrode that includes a self-healing electrode (e.g., an aluminum electrode) may be approximately 20 nm.

The electrodes in some configurations may be configured to stretch elastically. In such embodiments, the electrodes may include TCOs, graphene, carbon nanotubes, and the like. In other embodiments, relatively rigid electrodes (e.g. electrodes including a metal such as aluminum) may be used. The electrode, i.e., the electrode material, may be selected to achieve a desired deformability, transparency, and optical clarity for a given application. By way of example, the yield point of a deformable electrode may occur at an engineering strain of at least 0.5%.

The electrodes (e.g., the primary electrode and the secondary electrode) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In another aspect, the electrodes may be manufactured using a thermal evaporator, a sputtering system, a spray coater, a spin-coater, an ALD unit, and the like.

The application of a voltage between the electrodes can cause compression of the intervening structurally-modified electroactive polymer layer(s) in the direction of the applied electric field and an associated expansion or contraction of the electroactive polymer layer(s) in one or more transverse dimensions. In some embodiments, an applied voltage (e.g., to the primary electrode and/or the secondary electrode) may create at least approximately 0.1% strain (e.g., an amount of deformation in the direction of the applied force resulting from the applied voltage divided by the initial dimension of the material) in the structurally-modified electroactive polymer element(s) in at least one direction (e.g., an x, y, or z direction with respect to a defined coordinate system).

Optionally in conjunction with the foregoing multilayer configurations, and in accordance with some embodiments, the electromechanical response of a structurally-modified electroactive polymer may be controlled by pre-tensioning the electroactive polymer layer. In this regard, disclosed are single-layer, bi-layer, and multi-layer architectures that include at least one pre-strained electroactive polymer layer.

Figure 11:
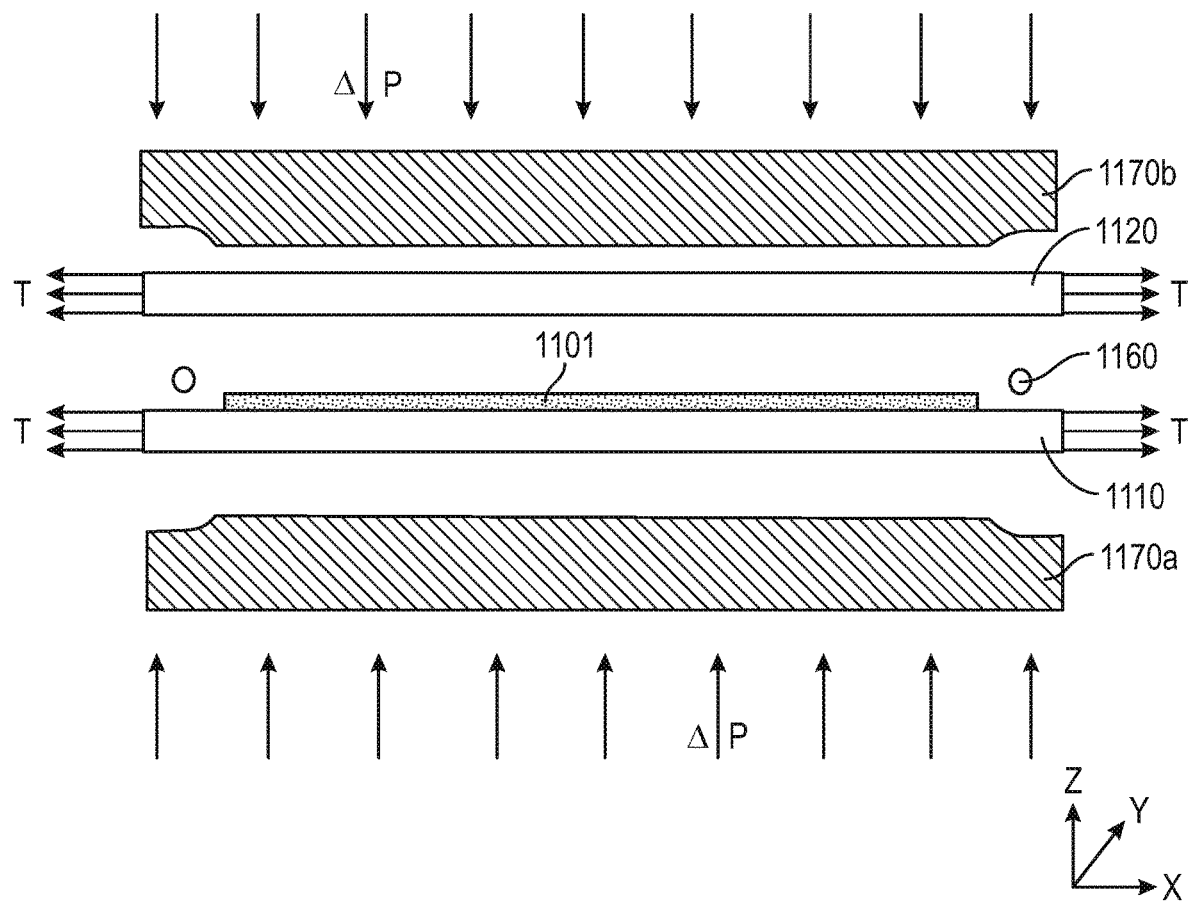
FIG. 11 illustrates an example method for fabricating a pre-tensioned multi-layer stack according to certain embodiments.
Figure 12:
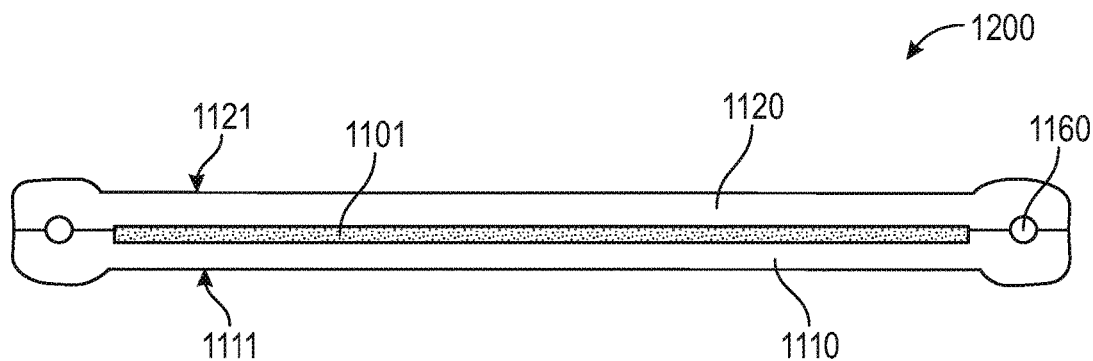
FIG. 12 shows an example laminate structure having an embedded retaining ring formed using the method illustrated in FIG. 11 according to various embodiments.

With reference to FIG. 11 and FIG. 12, for example, a lamination process may be used to form a pre-tensioned stack. In the referenced process, a primary electroactive polymer layer 1110 (e.g., structurally-modified electroactive layer 1110) and a secondary electroactive polymer layer 1120 (e.g., structurally-modified electroactive layer 1120) may be stretched in at least one dimension and laid up between opposing bottom and top mold elements 1170a, 1170b.

In certain embodiments, PVDF homopolymer, co-polymer and ter-polymer, e.g., primary and secondary electroactive polymer layers 1110,1120 may be manufactured using evaporative techniques from a solution or suspension of one or more suitable precursors to produce high optical quality, solvent cast films. Example solvent casting methods include, but are not limited to, spin coating, screen printing and inkjet printing.

In some embodiments, the tensioning (T) applied to each of the primary electroactive polymer layer 1110 and the secondary electroactive polymer layer 1120 may be equal and along a common axis (e.g., along the x-axis, as shown). In some embodiments, tensioning of a first magnitude may be applied to the primary electroactive polymer layer 1110 along a first direction and tensioning of a second magnitude may be applied to the secondary electroactive polymer layer 1120 along a second dimension, where the first and second magnitudes and the first and second directions may be respectively equal or unequal.

An electrode, such as a ground electrode 1101, may be formed over a surface of one or both of the primary and the secondary electroactive polymer layers 1110,1120, such that the ground electrode 1101 is disposed between the laid up polymer layers 1110,1120. A rigid frame 1160, which may be disposed between the polymer layers 1110, 1120 and peripheral to the ground electrode 1101, may be used in conjunction with such a process to maintain line tension within the polymer layer(s) during lamination. The rigid frame 1160 may include carbon fiber, a metal such as steel, or other suitably stiff material.

The primary and secondary electroactive polymer layers 1110,1120 may be compressed together by applying heat (A) and/or pressure (P) using a process such as compression molding. For a multilayer geometry that is symmetric about the center, for example, hoop strength may support the in-plane line tension with minimal torsional loading. The laminated structure 1200 is shown in FIG. 12.

Referring to FIG. 12, further electrodes (not shown) may be formed over outer surfaces of the laminated structure 1200, i.e., over a bottom surface 1111 of the primary electroactive polymer layer 1110 and over a top surface 1121 of the secondary electroactive polymer layer 1120.

Figure 13:
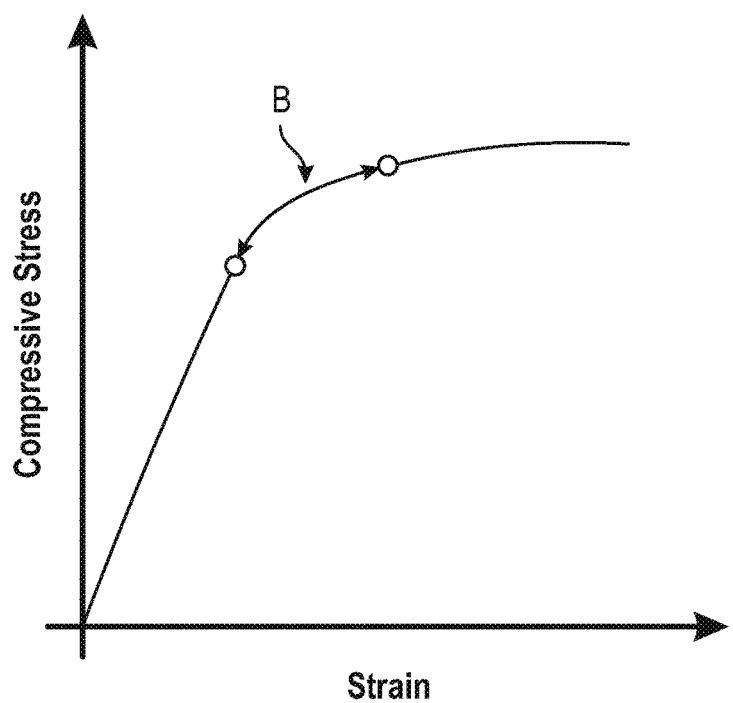
FIG. 13 is a diagram showing a compressive stress-strain curve for a buckling plate according to some embodiments.

According to further embodiments, compression and non-uniform tension between layers in a multilayer stack can be used to reduce force requirements through a buckled layer design. The stress-strain curve for a buckled plate is shown in FIG. 13. Highlighted is the buckling regime (B), where high strain can be achieved with a comparatively low change in stress.

Buckled or shell structures may be fabricated by applying a compressive stress radially to layers during or after stack fabrication, such as in conjunction with the lamination process described in connection with FIGS. 11 and 12. Alternatively, differential pre-tension applied to layers during lamination can cause buckling when the layers relax. An example buckled architecture including a primary electroactive polymer layer 1410 (e.g., structurally-modified electroactive layer 1410) and the secondary electroactive polymer layer 1420 (e.g., structurally-modified electroactive layer 1420) is depicted in FIG. 14.

As will be appreciated, the physical form of a buckled structure may be similar to that of a shell structure, although the stress states and shape profiles may vary. For instance, a buckled structure may exhibit a residual compressive pre-stress whereas a shell structure may have little or no residual stress.

According to some embodiments, a shell structure may be spherical, aspherical, or exhibit a Gaussian or a freeform surface. With reference now to FIG. 15, according to some embodiments, a shell structure including a primary electroactive polymer layer 1510 (e.g., structurally-modified electroactive layer 1510) and a secondary electroactive polymer layer 1520 (e.g., structurally-modified electroactive layer 1520) may be manufactured using a thermoforming process. In an example method, secondary electroactive polymer layer 1520 may be formed over primary electroactive polymer layer 1510 and the resulting composite structure placed over a mold 1500. The composite structure may be formed into a shell structure by applying pressure (P) and/or heat (A), i.e., to a top surface of the secondary electroactive polymer layer 1520. A shell structure is inherently non-planar.

In various lens structures, including ophthalmic lenses, planar surfaces are typically avoided because of frame wrap aesthetics, eyelash clearance requirements, and their propensity to generate unwanted reflections and glare. For a liquid lens used in virtual reality/augmented reality devices or ophthalmic applications, a shell design may advantageously enable the formation of meniscus lenses and lenses with an optical power bias having non-planar surface configurations at zero electrical power.

Figure 17:
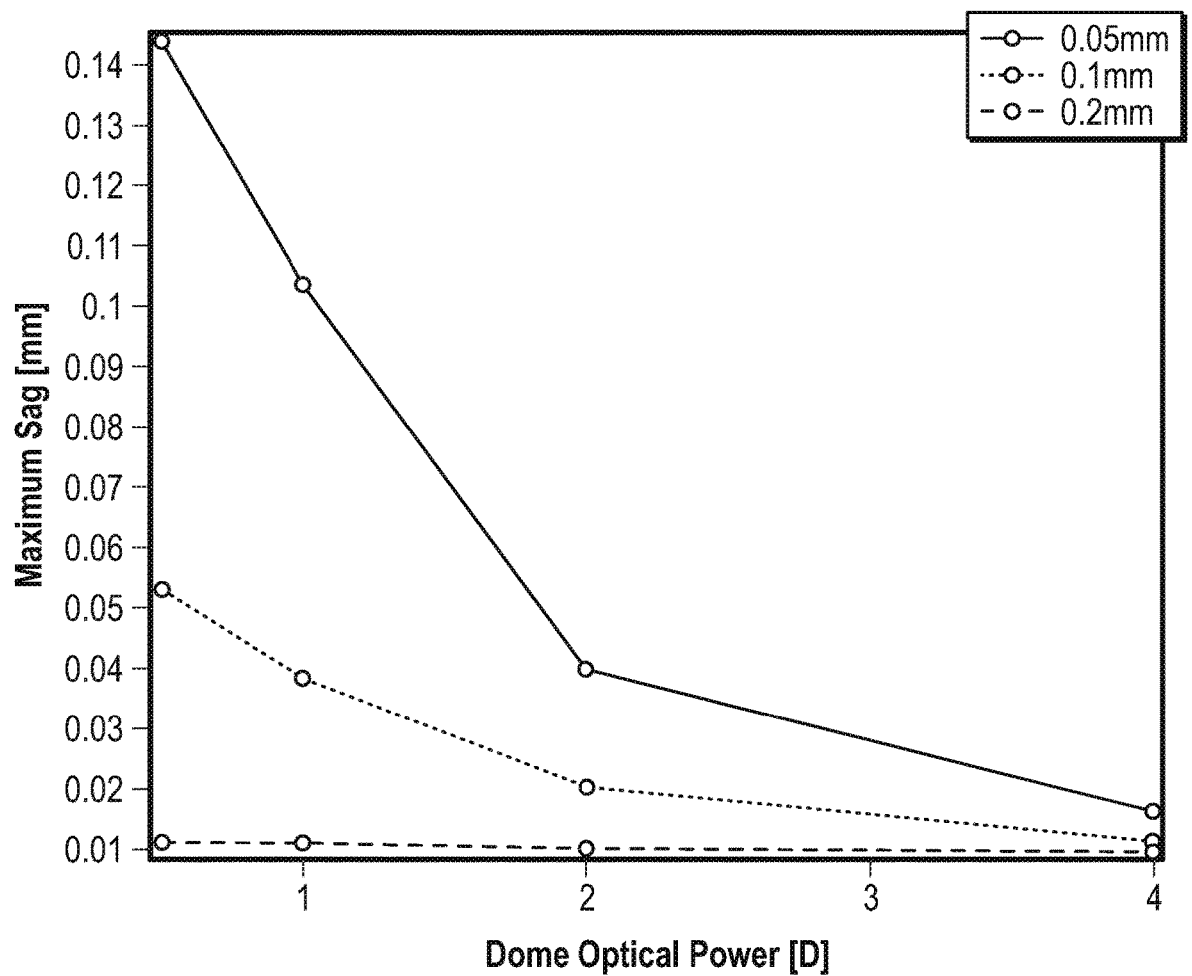
FIG. 17 is a plot showing the maximum sag value as a function of surface optical power for various optical layer thicknesses according to some embodiments.

In addition to the foregoing, thin elastic shells are characteristically rigid, which makes a shell geometry attractive for mitigating the effects of gravity sag. The effect of surface optical power and geometry on the gravity sag of a spherical dome are shown in FIG. 16 and FIG. 17, respectively. Referring to FIG. 16, as the dome curvature increases, the structure becomes more rigid and gravity sag decreases nearly exponentially.

Referring to FIG. 17, for a thin PVDF design (on the order of 50 μm) and surface curvatures consistent with ophthalmic optics, significant gravity sag mitigation may be possible without requiring added layer thickness or the addition of pre-tension, which may otherwise introduce assembly and design complexity. For a shell structure, stretching is less energetically favorable compared to bending. Thus, for large deflections, the force-displacement curve will typically remain linear and there will be no appreciable increase in force that results from added stretch, as is the case with layer deformation.

Varifocal applications outside of ophthalmics or virtual reality/augmented reality, such as variable focus camera and microscope lenses, may require higher optical power with a large non-zero baseline optical power. In various embodiments, these characteristics may be enabled with a shell design. Referring to FIG. 18, for example, illustrated is optical power as a function of required gravity sag for a spherical lens surface. For larger optical powers, the slope of the curve decreases, which may indicate that a larger shift in optical power is possible with less displacement. The information in FIG. 18 suggests that the most efficient shift in optical power may occur around a high optical power bias. Similar trends likely exist and, in conjunction with further embodiments, may be exploited for other surface forms such as parabolic, asphere, or Gaussian.

In accordance with various embodiments, example augmented reality stack designs based on a shell or buckled plate lens geometry and incorporating a structurally-modified electroactive polymer are shown in FIGS. 19-22. In some examples, the lens may be an adjustable lens. An "adjustable lens" may include any suitable type of lens with variable and controllable optical properties (e.g., adjustable optical power/focal length, correcting for wavefront distortion and/or aberrations, etc.). In some examples, an adjustable lens may include a liquid lens.

Figure 19:
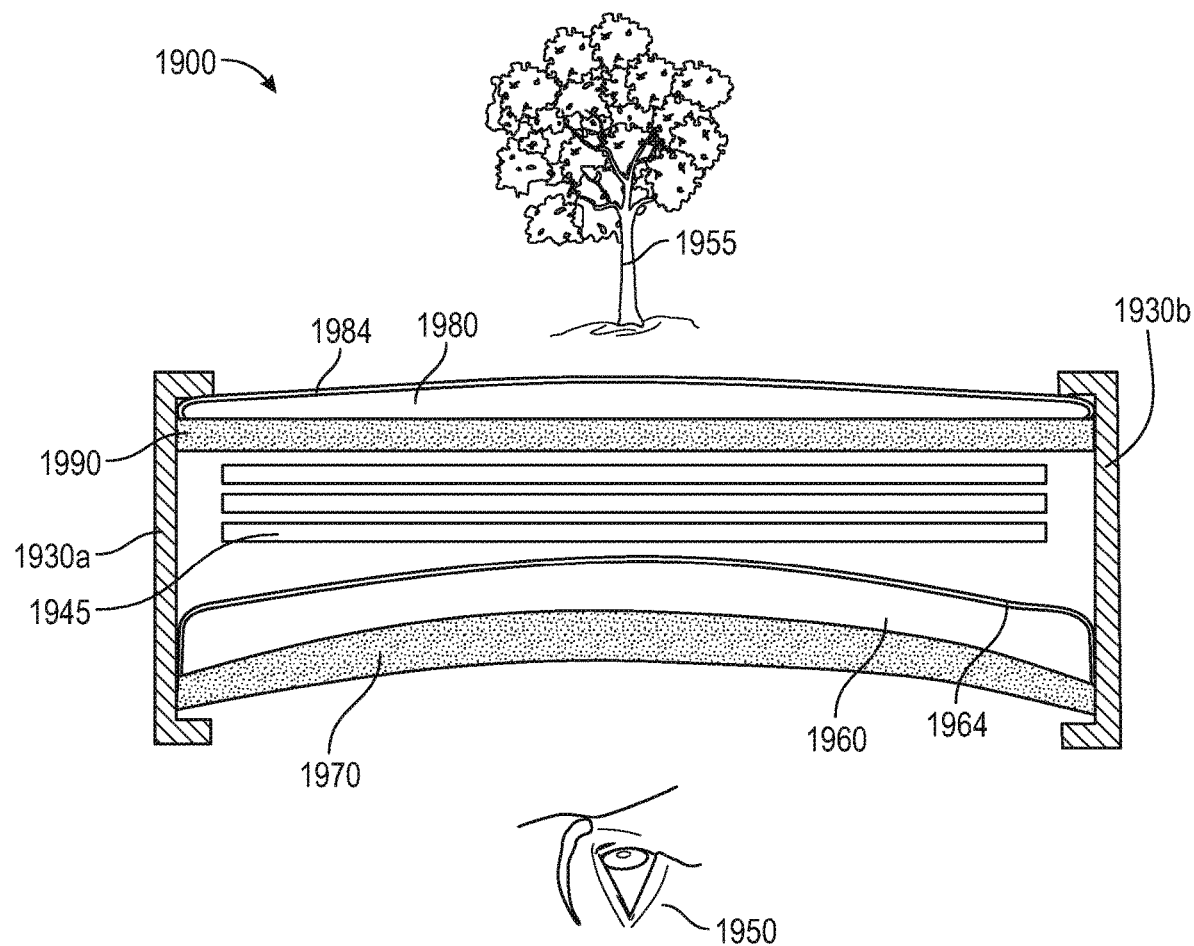
FIG. 19 is a schematic diagram of an augmented reality device stack based on a shell or buckled plate design according to some embodiments.

With reference to FIG. 19, shown is a cross-sectional view of an example lens assembly device with multiple deformable elements (e.g., multiple liquid lenses) including one or more layers of a structurally-modified electroactive polymer disposed over one or more surfaces of one or more of the lenses, in accordance with some embodiments of the disclosure.

In particular, FIG. 19 shows a side view of a lens-display assembly. Lens-display assembly 1900 may include an inner adjustable-focus lens 1960 and an outer (i.e., world side) adjustable-focus lens 1980. An adjustable-focus lens may be filled with an optical medium that is at least partially encapsulated by a structurally-modified electroactive polymer. For example, adjustable-focus lenses 1960, 1980 may be filled with a liquid or a semi-solid material (e.g., a gas, gel, foam, or a semi-solid polymer, etc.). In general, adjustable-focus lenses 1960, 1980 may contain a substantially transparent material that deforms and/or flows under pressure.

In some embodiments, lens-display assembly 1900 may additionally include a carriage 1930a and a carriage 1930b, each of which connects inner adjustable-focus lens 1960 to outer adjustable-focus lens 1980. In some examples, one or more of the carriages 1930a, 1930b may be rigid. Additionally or alternatively, one or more of the carriages 1930a, 1930b may have a degree of elasticity in one or more directions. In some examples, the length of the carriages 1930a, 1930b may be fixed. In some examples, the length of the carriages 1930a, 1930b may be adjustable. For example, the length of a carriage may be manually adjustable by using, e.g., a set screw or an adjustable threaded shaft. Additionally or alternatively, the length of a carriage may be dynamically adjustable through the use of, for example, a piezoelectric stack, such as an optical element as disclosed herein.

In some examples, lens-display assembly 1900 may include a display 1945 situated between inner and outer adjustable-focus lenses 1960 and 1980. Display 1945 may include an augmented-reality display that is substantially transparent (except for, e.g., virtual objects displayed by display 1945), allowing a user's eye 1950 to see beyond display 1945 to real-world objects such as a tree 1955 as illustrated in FIG. 19.

In some embodiments, additional optical elements such as lens 1970 and lens 1990 may be included to provide additional optical power. In some embodiments, the lenses 1970 and 1990 may include prescription lenses that may be used to treat refractive errors of the eye, which may include, for example, myopia, hypermetropia, astigmatism, and presbyopia, and the like. In other embodiments, the prescription lenses may be customized to correct for a given user's refractive errors, which may include various components, such as a sphere component to address myopia and/or presbyopia, a cylinder component to address astigmatism, and a prism component to address strabismus and other binocular vision disorders.

In certain embodiments, a layer of a structurally-modified electroactive polymer 1964, 1984 may be formed over a respective surface of each of the liquid lenses 1960, 1980 within the transparent aperture of the lens-display assembly 1900. Due to their transparency, outer structurally-modified electroactive polymer layer 1964 may be disposed directly over an outer surface of inner liquid lens 1960 and outer structurally-modified electroactive layer 1984 may be disposed directly over an outer surface of outer liquid lens 1980.

According to some embodiments, actuation and the attendant deformation of either (or both) of the structurally-modified electroactive polymer layers 1964, 1984 may be used to deform respective liquid lens 1960, 1980. For instance, liquid lens 1960 and/or liquid lens 1980 may be deformed relative to adjacent additional lens 1970, 1990.

In FIG. 19, the lens-display assembly 1900 is shown with structurally-modified electroactive polymer layers 1964, 1984 each in an unactuated or substantially unactuated state. In accordance with some embodiments, an image may be fixed at −0.5D at zero electrical power, requiring a +0.5D correction with the outer lens 1980. With net optical power at zero electrical power, the shell or buckled plate geometry is an example design for liquid lenses with a biased optical power. Shown in FIG. 19 is a baseline configuration with −0.5D/+0.5D lenses.

Figure 20:
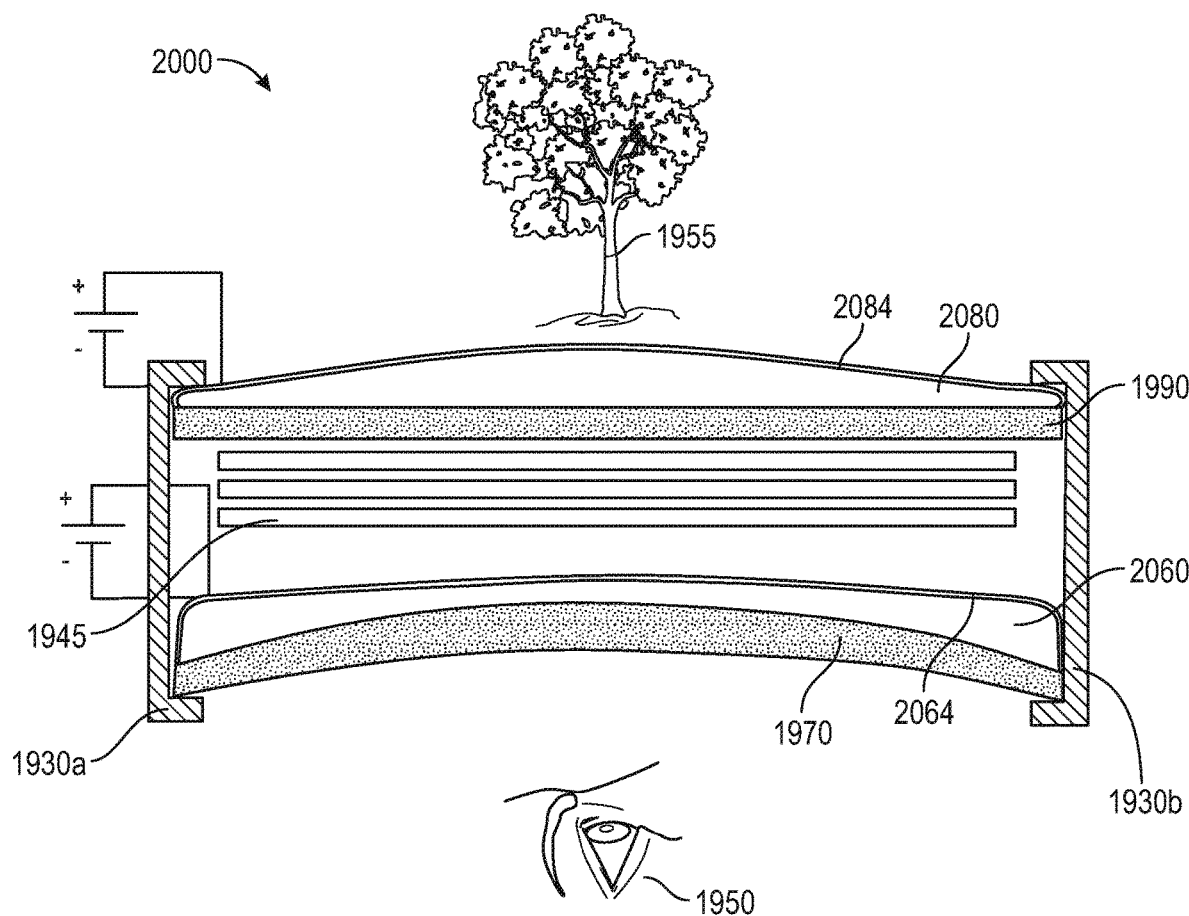
FIG. 20 is a schematic diagram of the augmented reality device stack of FIG. 19 in an actuated state according to some embodiments.

According to some embodiments, by applying a voltage between respective primary and secondary electrode pairs (not shown), actuation of the structurally-modified electroactive polymer layers 1964, 1984 may apply a force to, and deform, respective liquid lenses 1960, 1980. In this regard, FIG. 20 depicts the lens display assembly 1900 in an actuated state. In FIG. 20, lens-display assembly 2000 includes actuated structurally-modified electroactive polymer layers 2064, 2084 and corresponding inner and outer liquid lenses 2060, 2080, which, in the instant embodiment, are displaced away from the user's eye 1950, e.g., in a −3.5D/+3.5D configuration.

Figure 21:
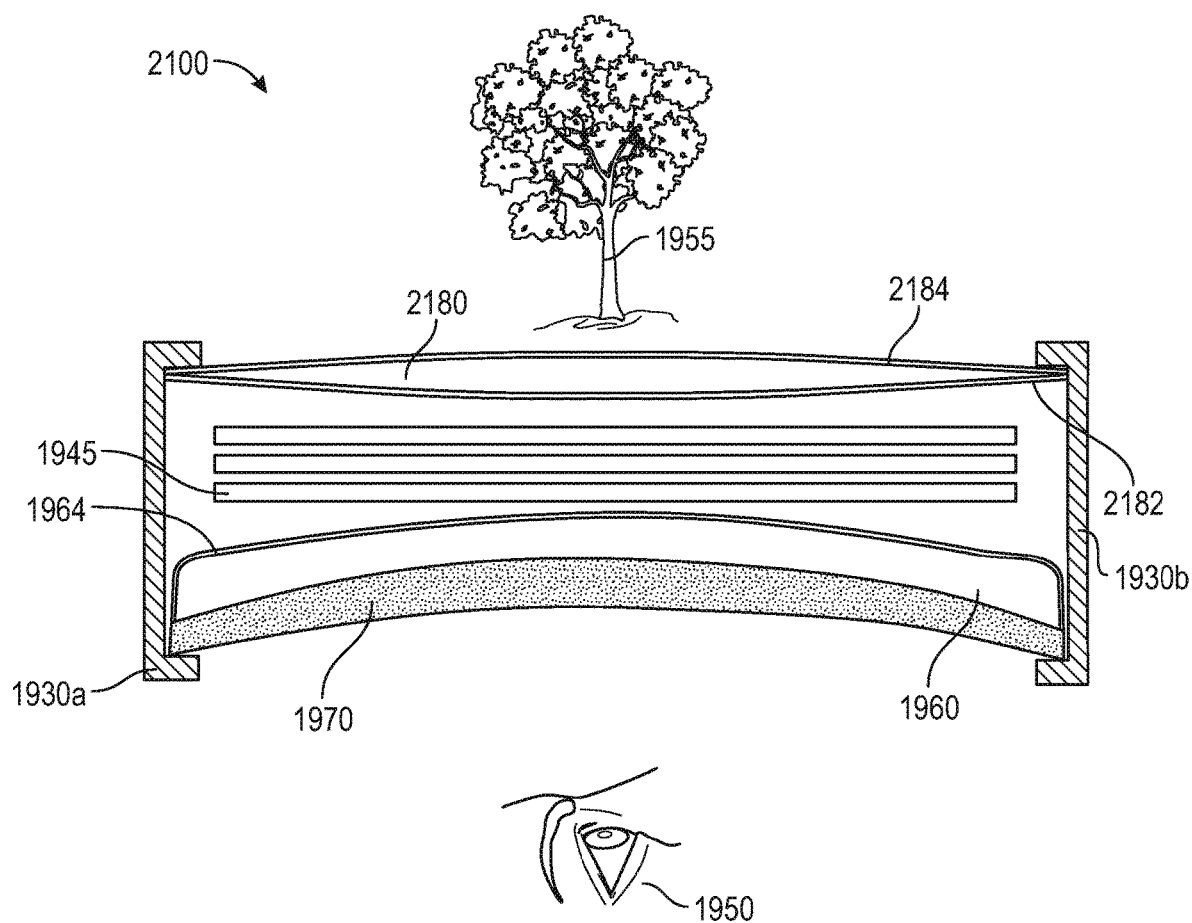
FIG. 21 is a schematic diagram of an augmented reality device stack design based on a shell architecture with a bi-convex world-side lens having dual active surfaces according to certain embodiments.

In lieu of, or in addition to, a structurally-modified electroactive polymer layer disposed over an outer surface of a liquid lens, in some embodiments, a structurally-modified electroactive polymer layer may be disposed over an inner surface of a liquid lens. Referring to FIGS. 21 and 22, for example, depicted is an alternate augmented reality stack design based on a shell architecture. In the embodiment of FIGS. 21 and 22, the outer (world side) liquid lens 2180 is bi-convex and includes an outer structurally-modified electroactive polymer layer 2184 disposed over an outer surface thereof and an inner structurally-modified electroactive polymer layer 2182 disposed over an inner surface thereof. Shown in FIG. 21 is a baseline configuration with unactuated structurally-modified electroactive polymer layers.

According to certain embodiments, structurally-modified electroactive polymer layers 1964, 2182, and 2184 may be actuated by the application of a voltage between respective primary and secondary electrode pairs (not shown). Actuation of structurally-modified electroactive polymer layer 1964 may deform inner liquid lens 1960, and actuation of structurally-modified electroactive polymer layers 2182, 2184 may deform outer liquid lens 2180.

In this regard, FIG. 22 depicts the lens display assembly 2100 in an actuated state. In FIG. 22, lens-display assembly 2200 includes actuated structurally-modified electroactive polymer layers 2064, 2282, and 2284 and corresponding deformed inner and outer liquid lenses 2060, 2280. In the case of outer liquid lens 2180, 2280, two electrically active surfaces may enable a larger change in displacement and therefore a wide optical power range compared to single active surface-based designs.

FIG. 23 is a diagram of a head-mounted display (HMD) 2300 according to some embodiments. The HMD 2300 may include a lens display assembly, which may include one or more display devices. The depicted embodiment includes a left lens display assembly 2310A and a right lens display assembly 2310B, which are collectively referred to as lens display assembly 2310, as described also with reference to FIGS. 19-22 (e.g., as lens display assemblies 1900, 2000, 2100, 2200). The lens display assembly 2310 may be located within a transparent aperture of the HMD 2300 and configured to present media to a user.

Examples of media presented by the lens display assembly 2310 include one or more images, a series of images (e.g., a video), audio, or some combination thereof. In some embodiments, audio may be presented via an external device (e.g., speakers and/or headphones) that receives audio information from the lens display assembly 2310, a console (not shown), or both, and presents audio data based on the audio information. The lens display assembly 2310 may generally be configured to operate as an augmented reality near-eye display (NED), such that a user can see media projected by the lens display assembly 2310 and also see the real-world environment through the lens display assembly 2310. However, in some embodiments, the lens display assembly 2310 may be modified to operate as a virtual reality NED, a mixed reality NED, or some combination thereof. Accordingly, in some embodiments, the lens display assembly 2310 may augment views of a physical, real-world environment with computer-generated elements (e.g., images, video, sound, etc.).

The HMD 2300 shown in FIG. 23 may include a support or frame 2305 that secures the lens display assembly 2310 in place on the head of a user, in embodiments in which the lens display assembly 2310 includes separate left and right displays. In some embodiments, the frame 2305 may be a frame of eyewear glasses. As is described herein in greater detail, the lens display assembly 2310, in some examples, may include a waveguide with holographic or volumetric Bragg gratings. In some embodiments, the gratings may be generated by a process of applying one or more dopants or photosensitive media to predetermined portions of the surface of the waveguide and subsequent ultraviolet (UV) light exposure or application of other activating electromagnetic radiation.

As disclosed herein, the electromechanical response of an optical element, e.g., located within the transparent aperture of a liquid lens, may be modified using molecular-level or macro-scale engineering. The optical element itself may include, for example, an electroactive polymer disposed between transparent, conductive electrodes. In exemplary polymer materials, such as PVDF, a desired electromechanical response may be attributed to a degree of crystallinity within the polymer matrix. In this vein, various molecular-level methods are disclosed for forming crystalline domains without adversely impacting the transparency of the polymer material, including irradiation, thermal annealing, hydrogenation, and the addition of nucleating agents. In various embodiments, irradiation may include x-ray, ultraviolet, or electron beam exposure.

At the macro-scale, the piezoelectric response of an elastomeric layer may be improved by pre-tensioning the layer. Single-layer, bi-layer, and multi-layer architectures are disclosed, and may optionally include pre-strained elastomeric layers. By way of example, a pre-tensioned stack may be formed by a lamination process. A rigid frame may be used in conjunction with such a process to maintain line tension within one or more polymer layers during lamination. Further manufacturing methods for the optical element are disclosed, including the formation of a buckled layer and thermoforming about a mold, which may be used to achieve a desired piezoelectric response while potentially obviating the need for introducing (and maintaining) layer pre-tension. Also disclosed are various AR stack designs based on a buckled layer or molded layer paradigms.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 2400 in FIG. 24. Other artificial reality systems may include a NED that also provides visibility into the real world (e.g., augmented-reality system 2500 in FIG. 25) or that visually immerses a user in an artificial reality (e.g., virtual-reality system 2600 in FIG. 26). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 24:
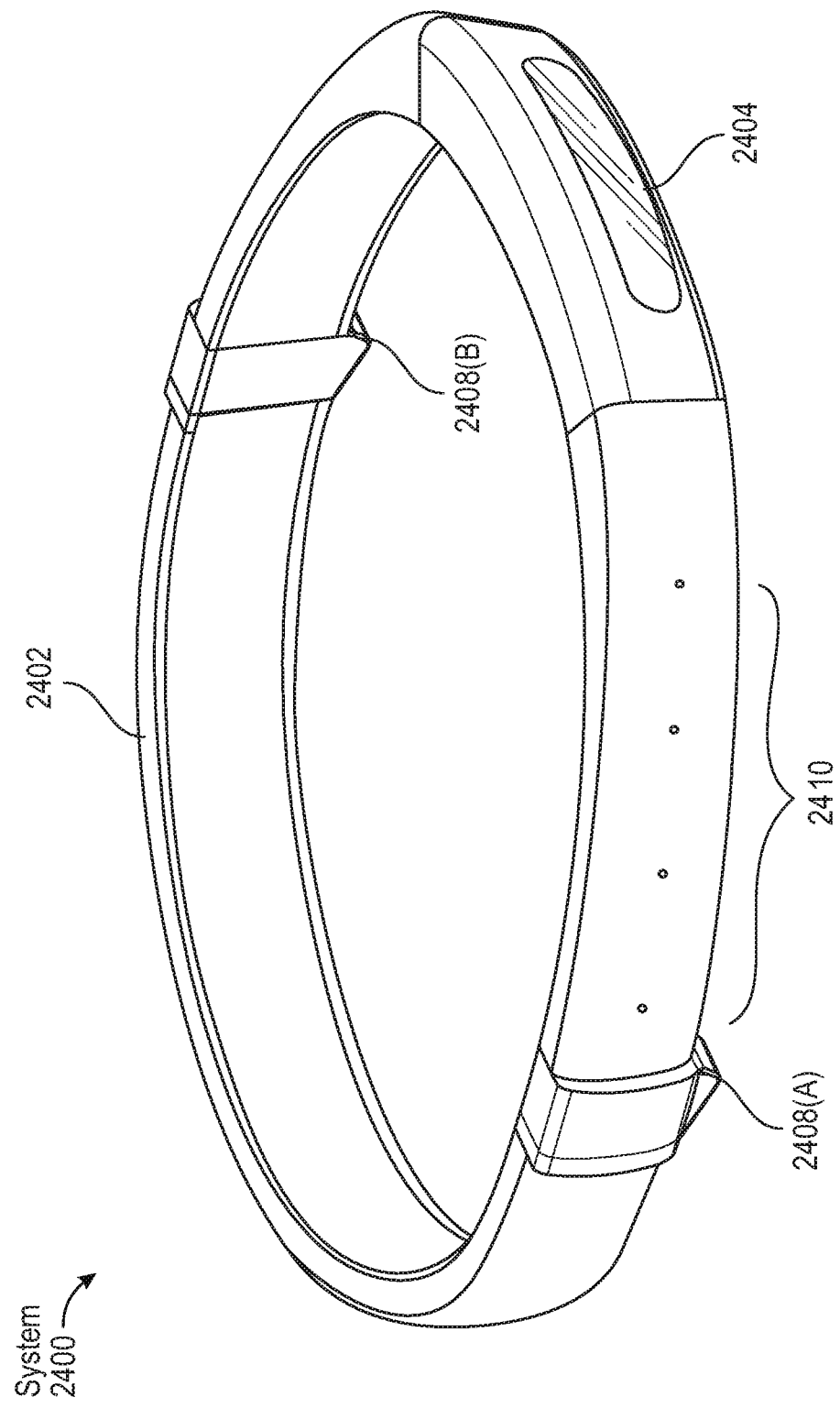
FIG. 24 is an illustration of an exemplary artificial-reality headband that may be used in connection with embodiments of this disclosure.

Turning to FIG. 24, augmented-reality system 2400 generally represents a wearable device dimensioned to fit about a body part (e.g., a head) of a user. As shown in FIG. 24, system 2400 may include a frame 2402 and a camera assembly 2404 that is coupled to frame 2402 and configured to gather information about a local environment by observing the local environment. Augmented-reality system 2400 may also include one or more audio devices, such as output audio transducers 2408(A) and 2408(B) and input audio transducers 2410. Output audio transducers 2408(A) and 2408(B) may provide audio feedback and/or content to a user, and input audio transducers 2410 may capture audio in a user's environment.

As shown, augmented-reality system 2400 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2400 may not include a NED, augmented-reality system 2400 may include other types of screens or visual feedback devices (e.g., a display screen integrated into a side of frame 2402).

Figure 25:
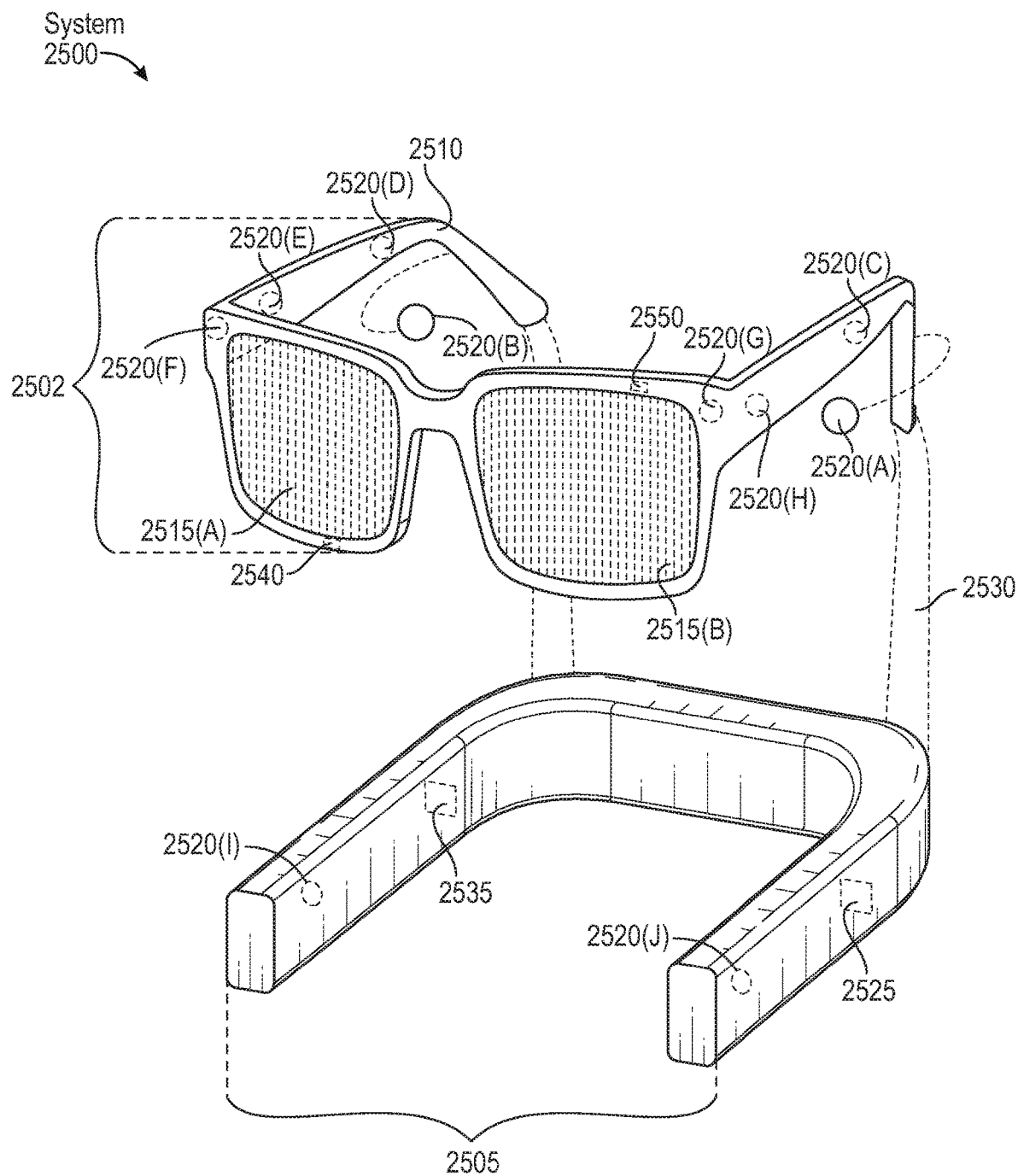
FIG. 25 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 25, augmented-reality system 2500 may include an eyewear device 2502 with a frame 2510 configured to hold a left display device 2515(A) and a right display device 2515(B) in front of a user's eyes. Display devices 2515(A) and 2515(B) may act together or independently to present an image or series of images to a user. While augmented-reality system 2500 includes two displays, embodiments of this disclosure may be implemented in augmented-reality systems with a single NED or more than two NEDs.

In some embodiments, augmented-reality system 2500 may include one or more sensors, such as sensor 2540. Sensor 2540 may generate measurement signals in response to motion of augmented-reality system 2500 and may be located on substantially any portion of frame 2510. Sensor 2540 may represent a position sensor, an inertial measurement unit (IMU), a depth camera assembly, or any combination thereof. In some embodiments, augmented-reality system 2500 may or may not include sensor 2540 or may include more than one sensor. In embodiments in which sensor 2540 includes an IMU, the IMU may generate calibration data based on measurement signals from sensor 2540. Examples of sensor 2540 may include, without limitation, accelerometers, gyroscopes, magnetometers, other suitable types of sensors that detect motion, sensors used for error correction of the IMU, or some combination thereof.

Augmented-reality system 2500 may also include a microphone array with a plurality of acoustic transducers 2520(A)-2520(J), referred to collectively as acoustic transducers 2520. Acoustic transducers 2520 may be transducers that detect air pressure variations induced by sound waves. Each acoustic transducer 2520 may be configured to detect sound and convert the detected sound into an electronic format (e.g., an analog or digital format). The microphone array in FIG. 25 may include, for example, ten acoustic transducers: 2520(A) and 2520(B), which may be designed to be placed inside a corresponding ear of the user, acoustic transducers 2520(C), 2520(D), 2520(E), 2520(F), 2520(G), and 2520(H), which may be positioned at various locations on frame 2510, and/or acoustic transducers 2520(I) and 2520(J), which may be positioned on a corresponding neckband 2505.

In some embodiments, one or more of acoustic transducers 2520(A)-(F) may be used as output transducers (e.g., speakers). For example, acoustic transducers 2520(A) and/or 2520(B) may be earbuds or any other suitable type of headphone or speaker.

The configuration of acoustic transducers 2520 of the microphone array may vary. While augmented-reality system 2500 is shown in FIG. 25 as having ten acoustic transducers 2520, the number of acoustic transducers 2520 may be greater or less than ten. In some embodiments, using higher numbers of acoustic transducers 2520 may increase the amount of audio information collected and/or the sensitivity and accuracy of the audio information. In contrast, using a lower number of acoustic transducers 2520 may decrease the computing power required by the controller 2550 to process the collected audio information. In addition, the position of each acoustic transducer 2520 of the microphone array may vary. For example, the position of an acoustic transducer 2520 may include a defined position on the user, a defined coordinate on frame 2510, an orientation associated with each acoustic transducer, or some combination thereof.

Acoustic transducers 2520(A) and 2520(B) may be positioned on different parts of the user's ear, such as behind the pinna or within the auricle or fossa. Or, there may be additional acoustic transducers on or surrounding the ear in addition to acoustic transducers 2520 inside the ear canal. Having an acoustic transducer positioned next to an ear canal of a user may enable the microphone array to collect information on how sounds arrive at the ear canal. By positioning at least two of acoustic transducers 2520 on either side of a user's head (e.g., as binaural microphones), augmented-reality device 2500 may simulate binaural hearing and capture a 3D stereo sound field around about a user's head. In some embodiments, acoustic transducers 2520(A) and 2520(B) may be connected to augmented-reality system 2500 via a wired connection 2530, and in other embodiments, acoustic transducers 2520(A) and 2520(B) may be connected to augmented-reality system 2500 via a wireless connection (e.g., a Bluetooth connection). In still other embodiments, acoustic transducers 2520(A) and 2520(B) may not be used at all in conjunction with augmented-reality system 2500.

Acoustic transducers 2520 on frame 2510 may be positioned along the length of the temples, across the bridge, above or below display devices 2515(A) and 2515(B), or some combination thereof. Acoustic transducers 2520 may be oriented such that the microphone array is able to detect sounds in a wide range of directions surrounding the user wearing the augmented-reality system 2500. In some embodiments, an optimization process may be performed during manufacturing of augmented-reality system 2500 to determine relative positioning of each acoustic transducer 2520 in the microphone array.

In some examples, augmented-reality system 2500 may include or be connected to an external device (e.g., a paired device), such as neckband 2505. Neckband 2505 generally represents any type or form of paired device. Thus, the following discussion of neckband 2505 may also apply to various other paired devices, such as charging cases, smart watches, smart phones, wrist bands, other wearable devices, hand-held controllers, tablet computers, laptop computers and other external compute devices, etc.

As shown, neckband 2505 may be coupled to eyewear device 2502 via one or more connectors. The connectors may be wired or wireless and may include electrical and/or non-electrical (e.g., structural) components. In some cases, eyewear device 2502 and neckband 2505 may operate independently without any wired or wireless connection between them. While FIG. 25 illustrates the components of eyewear device 2502 and neckband 2505 in example locations on eyewear device 2502 and neckband 2505, the components may be located elsewhere and/or distributed differently on eyewear device 2502 and/or neckband 2505. In some embodiments, the components of eyewear device 2502 and neckband 2505 may be located on one or more additional peripheral devices paired with eyewear device 2502, neckband 2505, or some combination thereof.

Pairing external devices, such as neckband 2505, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2500 may be provided by a paired device or shared between a paired device and an eyewear device, thus reducing the weight, heat profile, and form factor of the eyewear device overall while still retaining desired functionality. For example, neckband 2505 may allow components that would otherwise be included on an eyewear device to be included in neckband 2505 since users may tolerate a heavier weight load on their shoulders than they would tolerate on their heads. Neckband 2505 may also have a larger surface area over which to diffuse and disperse heat to the ambient environment. Thus, neckband 2505 may allow for greater battery and computation capacity than might otherwise have been possible on a stand-alone eyewear device. Since weight carried in neckband 2505 may be less invasive to a user than weight carried in eyewear device 2502, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2505 may be communicatively coupled with eyewear device 2502 and/or to other devices. These other devices may provide certain functions (e.g., tracking, localizing, depth mapping, processing, storage, etc.) to augmented-reality system 2500. In the embodiment of FIG. 25, neckband 2505 may include two acoustic transducers (e.g., 2520(I) and 2520(J)) that are part of the microphone array (or potentially form their own microphone subarray). Neckband 2505 may also include a controller 2525 and a power source 2535.

Acoustic transducers 2520(I) and 2520(J) of neckband 2505 may be configured to detect sound and convert the detected sound into an electronic format (analog or digital). In the embodiment of FIG. 25, acoustic transducers 2520(I) and 2520(J) may be positioned on neckband 2505, thereby increasing the distance between the neckband acoustic transducers 2520(I) and 2520(J) and other acoustic transducers 2520 positioned on eyewear device 2502. In some cases, increasing the distance between acoustic transducers 2520 of the microphone array may improve the accuracy of beamforming performed via the microphone array. For example, if a sound is detected by acoustic transducers 2520(C) and 2520(D) and the distance between acoustic transducers 2520(C) and 2520(D) is greater than, e.g., the distance between acoustic transducers 2520(D) and 2520(E), the determined source location of the detected sound may be more accurate than if the sound had been detected by acoustic transducers 2520(D) and 2520(E).

Controller 2525 of neckband 2505 may process information generated by the sensors on 2505 and/or augmented-reality system 2500. For example, controller 2525 may process information from the microphone array that describes sounds detected by the microphone array. For each detected sound, controller 2525 may perform a direction-of-arrival (DOA) estimation to estimate a direction from which the detected sound arrived at the microphone array. As the microphone array detects sounds, controller 2525 may populate an audio data set with the information. In embodiments in which augmented-reality system 2500 includes an inertial measurement unit, controller 2525 may compute all inertial and spatial calculations from the IMU located on eyewear device 2502. A connector may convey information between augmented-reality system 2500 and neckband 2505 and between augmented-reality system 2500 and controller 2525. The information may be in the form of optical data, electrical data, wireless data, or any other transmittable data form. Moving the processing of information generated by augmented-reality system 2500 to neckband 2505 may reduce weight and heat in eyewear device 2502, making it more comfortable to the user.

Power source 2535 in neckband 2505 may provide power to eyewear device 2502 and/or to neckband 2505. Power source 2535 may include, without limitation, lithium ion batteries, lithium-polymer batteries, primary lithium batteries, alkaline batteries, or any other form of power storage. In some cases, power source 2535 may be a wired power source. Including power source 2535 on neckband 2505 instead of on eyewear device 2502 may help better distribute the weight and heat generated by power source 2535.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2600 in FIG. 26, that mostly or completely covers a user's field of view. Virtual-reality system 2600 may include a front rigid body 2602 and a band 2604 shaped to fit around a user's head. Virtual-reality system 2600 may also include output audio transducers 2606(A) and 2606(B). Furthermore, while not shown in FIG. 26, front rigid body 2602 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2600 and/or virtual-reality system 2600 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 2500 and/or virtual-reality system 2600 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2400, augmented-reality system 2500, and/or virtual-reality system 2600 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 24 and 26, output audio transducers 2408(A), 2408(B), 2606(A), and 2606(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2410 may include condenser microphones, dynamic microphones, ribbon microphones, and/or any other type or form of input transducer. In some embodiments, a single transducer may be used for both audio input and audio output.

Figure 26:
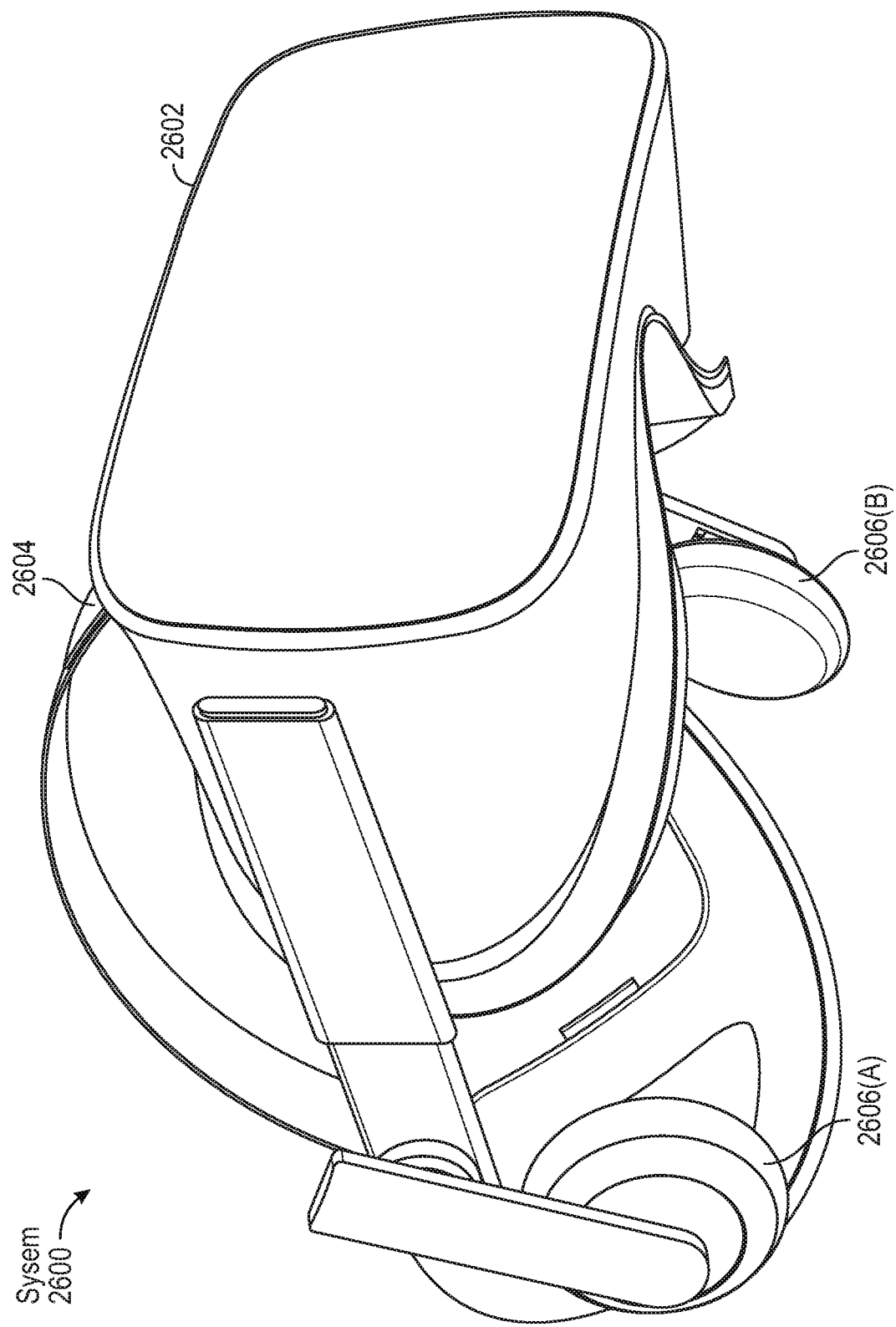
FIG. 26 is an illustration of an exemplary virtual-reality headset that may be used in connection with embodiments of this disclosure.

While not shown in FIGS. 24-26, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical element comprising:
a primary electrode;
a secondary electrode overlapping at least a portion of the primary electrode; and
a transparent, structurally-modified electroactive polymer disposed between and abutting the primary electrode and the secondary electrode;
wherein a surface of the structurally-modified electroactive polymer facing at least one of the primary electrode or the secondary electrode is non-planar when zero voltage is applied between the primary electrode and the secondary electrode.

2. The optical element of claim 1, wherein the structurally-modified electroactive polymer comprises a piezoelectric polymer or an electrostrictive polymer.

3. The optical element of claim 1, wherein the electroactive polymer comprises a PVDF homopolymer, a P(VDF-TrFE) co-polymer, a P(VDF-TrFE-CFE) ter-polymer or a P(VDF-TrFE-CTFE) ter-polymer.

4. The optical element of claim 1, wherein the structurally-modified electroactive polymer comprises a transmissivity within the visible spectrum of at least approximately 20% and less than approximately 10% haze when the structurally-modified electroactive polymer has a thickness of between approximately 10 nm and approximately 100 µm.

5. The optical element of claim 1, wherein the structurally-modified electroactive polymer comprises a non-zero stress state when the zero voltage is applied between the primary electrode and the secondary electrode.

6. The optical element of claim 1, further comprising a multi-layer stack including the primary electrode, the secondary electrode and the structurally-modified electroactive polymer, wherein the multi-layer stack comprises a unimorph architecture, a bi-morph architecture or a multimorph architecture.

7. The optical element of claim 1, wherein the structurally-modified electroactive polymer comprises particles of a nucleating agent.

8. The optical element of claim 7, wherein the particles comprise a material selected from the group consisting of graphene, carbon nanotubes, hexagonal boron nitride, and oxide nanoparticles.

9. The optical element of claim 1, wherein the structurally-modified electroactive polymer is at least partially hydrogenated.

10. The optical element of claim 1, wherein the structurally-modified electroactive polymer comprises a molecular-level defect.

11. The optical element of claim 1, wherein the structurally-modified electroactive polymer comprises nanocrystalline domains.

12. An optical device, comprising:
a tunable lens; and
a first optical element disposed over a first surface of the tunable lens, wherein the first optical element comprises:
   a primary electrode;
   a secondary electrode overlapping at least a portion of the primary electrode; and
   a transparent, structurally-modified electroactive polymer disposed between and abutting the primary electrode and the secondary electrode;
   wherein a surface of the structurally-modified electroactive polymer facing at least one of the primary electrode or the secondary electrode is non-planar when zero voltage is applied between the primary electrode and the secondary electrode.

13. The optical device of claim 12, wherein the tunable lens comprises a liquid lens.

14. The optical device of claim 12, wherein the tunable lens comprises a geometry selected from the group consisting of prismatic, freeform, plano, meniscus, bi-convex, plano-convex, bi-concave, and plano-concave.

15. The optical device of claim 12, wherein a second optical element is disposed over a second surface of the tunable lens.

16. A head mounted display comprising the optical device of claim 12, wherein the optical device is located within a transparent aperture of the head mounted display.

17. A method comprising:
forming an electroactive polymer layer over a primary electrode;
structurally modifying the electroactive polymer layer; and
forming a secondary electrode over the electroactive polymer layer,
wherein:
   a surface of the structurally-modified electroactive polymer facing at least one of the primary electrode or the secondary electrode is non-planar when zero voltage is applied between the primary electrode and the secondary electrode; and
   structurally modifying the electroactive polymer layer comprises at least one of:
      applying stress to the electroactive polymer layer,
      incorporating particles of a filler material within the electroactive polymer,
      thermally annealing the electroactive polymer,
      hydrogenating the electroactive polymer, and
      irradiating the electroactive polymer layer.

18. The method of claim 17, wherein the structurally-modified electroactive polymer layer is transparent.

19. The method of claim 17, wherein the structurally-modified electroactive polymer layer and at least one of the primary electrode or the secondary electrode are formed by co-extrusion.

* * * * *